(12) United States Patent
Song et al.

(10) Patent No.: US 12,205,914 B2
(45) Date of Patent: Jan. 21, 2025

(54) SEMICONDUCTOR PACKAGE

(71) Applicant: SAMSUNG ELECTRONICS CO., LTD., Suwon-si (KR)

(72) Inventors: Inhyung Song, Cheonan-si (KR); Seokhyun Lee, Hwaseong-si (KR); Jongyoun Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 333 days.

(21) Appl. No.: 17/648,425

(22) Filed: Jan. 20, 2022

(65) Prior Publication Data
US 2022/0367402 A1    Nov. 17, 2022

(30) Foreign Application Priority Data
May 14, 2021    (KR) .................... 10-2021-0062776

(51) Int. Cl.
*H01L 23/00*    (2006.01)
*H01L 23/31*    (2006.01)
(Continued)

(52) U.S. Cl.
CPC .......... *H01L 24/17* (2013.01); *H01L 23/3128* (2013.01); *H01L 23/5383* (2013.01);
(Continued)

(58) Field of Classification Search
CPC ......... H01L 24/17; H01L 24/06; H01L 24/16; H01L 24/32; H01L 24/02; H01L 24/81; H01L 23/49816; H01L 23/5382; H01L 23/3128; H01L 23/5383; H01L 23/5385; H01L 2224/0401; H01L 2224/6146;
(Continued)

(56) References Cited

U.S. PATENT DOCUMENTS 9,485,878 B2 * 11/2016 Lee .................. H05K 1/185
10,153,253 B2   12/2018 Loo et al.
(Continued)

FOREIGN PATENT DOCUMENTS

KR    10-2017-0077757    7/2017
TW    202029451 A *    8/2020    ......... H01L 23/3121

*Primary Examiner* — Lawrence C Tynes, Jr.
(74) *Attorney, Agent, or Firm* — F. CHAU & ASSOCIATES, LLC

(57) ABSTRACT

A semiconductor package includes a base substrate; a redistribution substrate disposed on the base substrate, and that includes first insulating layers and redistribution pattern layers disposed on the first insulating layers, respectively; a semiconductor chip disposed on the redistribution substrate and electrically connected to the redistribution pattern layers; and a chip structure disposed on the redistribution substrate adjacent to the semiconductor chip and electrically connected to the semiconductor chip through the redistribution pattern layers, wherein the semiconductor chip includes a body that has an active surface that faces the redistribution substrate; first and second contact pads spaced apart from each other below the active surface; a first bump structure and a passive device electrically connected to the first connection pad at a lower level from the first connection pad; and a second bump structure electrically connected to the second connection pad at a lower level from the second connection pad.

19 Claims, 17 Drawing Sheets

(51) Int. Cl.
*H01L 23/538* (2006.01)
*H01L 25/065* (2023.01)
*H01L 25/10* (2006.01)

(52) U.S. Cl.
CPC ............ *H01L 24/06* (2013.01); *H01L 24/16* (2013.01); *H01L 24/32* (2013.01); *H01L 24/73* (2013.01); *H01L 25/0655* (2013.01); *H01L 25/0657* (2013.01); *H01L 25/105* (2013.01); *H01L 2224/0401* (2013.01); *H01L 2224/061* (2013.01); *H01L 2224/16146* (2013.01); *H01L 2224/16227* (2013.01); *H01L 2224/1703* (2013.01); *H01L 2224/17515* (2013.01); *H01L 2224/32145* (2013.01); *H01L 2224/32225* (2013.01); *H01L 2224/73204* (2013.01); *H01L 2225/06513* (2013.01); *H01L 2225/06541* (2013.01)

(58) Field of Classification Search
CPC ............ H01L 2224/16227; H01L 2224/1703; H01L 2224/17515; H01L 2224/73204; H01L 2224/02371; H01L 2224/81; H01L 2224/32145; H01L 2225/06513; H01L 2225/06517; H01L 2225/1058; H01L 25/0657; H01L 25/0655
See application file for complete search history.

(56) References Cited

U.S. PATENT DOCUMENTS

| | | | |
|---|---|---|---|
| 10,224,309 | B2 | 3/2019 | Lee |
| 10,720,401 | B2 | 7/2020 | Ting et al. |
| 11,735,572 | B2* | 8/2023 | Jeng .................... H01L 25/0652 257/668 |
| 11,855,003 | B2* | 12/2023 | Wang .................. H01L 21/4853 |
| 2016/0118332 | A1* | 4/2016 | Lin ........................ H01L 22/20 257/773 |
| 2017/0188458 | A1 | 6/2017 | Hsieh et al. |
| 2020/0075510 | A1 | 3/2020 | Chang Chien et al. |
| 2020/0176387 | A1* | 6/2020 | Yu ....................... H01L 21/6835 |
| 2020/0185346 | A1 | 6/2020 | Venkatadri et al. |
| 2020/0194381 | A1* | 6/2020 | Park .................... H01L 23/3157 |
| 2020/0212018 | A1* | 7/2020 | Lai ...................... H01L 23/3121 |
| 2020/0243450 | A1* | 7/2020 | Cho ..................... H01L 23/5385 |
| 2021/0020574 | A1 | 1/2021 | Yu et al. |
| 2021/0098380 | A1* | 4/2021 | Chen .................... H01L 21/565 |
| 2021/0193582 | A1* | 6/2021 | Yu ....................... H01L 23/5386 |
| 2022/0320019 | A1* | 10/2022 | Chang .................. H01L 23/145 |

* cited by examiner

SEMICONDUCTOR PACKAGE

CROSS TO REFERENCE TO RELATED APPLICATION(S)

This application claims priority under 35 U.S.C. 119 from Korean Patent Application No. 10-2021-0062776, filed on May 14, 2021 in the Korean Intellectual Property Office, the contents of which are herein incorporated by reference in their entirety.

TECHNICAL FIELD

Embodiments of the present disclosure are directed to a semiconductor package.

DISCUSSION OF THE RELATED ART

A semiconductor package in which a high-performance semiconductor chip is embedded may have issues such as system malfunctioning, performance degradation, etc., due to voltage noise generated in a high-frequency band. Accordingly, a packaging technique may be needed that improves power integrity (PI) properties of a semiconductor package by removing voltage noise.

SUMMARY

An embodiment of the present disclosure provides a semiconductor package that has improved PI properties.

In an embodiment of the present disclosure, a semiconductor package includes a base substrate; a redistribution substrate disposed on the base substrate and that includes one or more first insulating layers and one or more redistribution pattern layers disposed on the one or more first insulating layers, respectively; a semiconductor chip disposed on the redistribution substrate and electrically connected to the one or more redistribution pattern layers; a chip structure disposed on the redistribution substrate adjacent to the semiconductor chip and electrically connected to the semiconductor chip through the one or more redistribution pattern layers; and an encapsulant that encapsulates at least a portion of each of the semiconductor chip and the chip structure. The semiconductor chip includes a body that has an active surface that faces the redistribution substrate; first and second contact pads spaced apart from each other below the active surface; a first bump structure and a passive device electrically connected to the first connection pad at a lower level from that of the first connection pad; and a second bump structure electrically connected to the second connection pad at a lower level from that of the second connection pad.

In an embodiment of the present disclosure, a semiconductor package includes a redistribution substrate that includes a redistribution pattern layer; a semiconductor chip disposed on the redistribution substrate and that includes a plurality of connection pads, a first wiring pattern layer electrically connected to the plurality of connection pads, a second wiring pattern layer that includes a plurality of first pads and a plurality of second pads electrically connected to the first wiring pattern layer, a plurality of bump structures that electrically connect each of the plurality of first pads to the redistribution pattern layer, and at least one passive device mounted on the plurality of second pads; and an underfill resin that fills a region between the plurality of bump structures and the at least one passive device. At least a portion of the plurality of connection pads overlaps the at least one passive device in a direction perpendicular to the active surface of the semiconductor chip that faces the redistribution substrate, and the first wiring pattern layer includes a first pattern portion that connects the portion of the connection pad that overlap the at least one passive device to at least a portion of the plurality of first pads.

In an embodiment of the present disclosure, a semiconductor package includes a semiconductor chip that includes a connection pad disposed on an active surface, a wiring pattern layer disposed on the connection pad, first and second pads disposed on the wiring pattern layer, a bump structure disposed on the first pad, and at least one passive device disposed on the second pad; and an underfill resin filling a region between the at least one passive device and the semiconductor chip. The first pad does not overlap the at least one passive device in a direction perpendicular to the active surface, the connection pad and the second pad overlap the at least one passive device in a direction perpendicular to the active surface, and the wiring pattern layer includes a first pattern portion that connects the connection pad to the first pad.

In an embodiment of the present disclosure, In an embodiment of the present disclosure, a method of manufacturing a semiconductor package includes providing a semiconductor wafer that includes a plurality of first semiconductor chips separated by scribe lanes, wherein each of the plurality of first semiconductor chips includes a body in which a connection pad is disposed, and a passivation layer that covers an upper surface of the body and has an opening that exposes at least a portion of the connection pad; forming a first wiring pattern layer that includes a first seed layer and a first plating layer, wherein the first seed layer is formed by depositing a metal on surfaces of the passivation layer and the exposed connection pad, and the first plating layer is formed by forming a photoresist on the first seed layer, patterning the photoresist, forming the first plating layer on those portions of the first seed layer exposed by the patterned photoresist, removing the patterned photoresist and etching the first seed layer; forming an insulating layer and a second wiring pattern layer on the passivation layer and the first wiring pattern layer, wherein the second wiring pattern layer includes a second seed layer and a second plating layer, wherein the insulating layer is formed by coating and curing a photosensitive resin that covers the passivation layer and the first wiring pattern layer, forming via holes that penetrate the insulating layer and expose portions of the surface of the first wiring pattern layer, and sequentially forming the second seed layer and the second plating layer on the surface of the insulating layer and the exposed surface of the first wiring pattern layer, wherein the second wiring pattern layer includes a via portion that fills the via hole, and first and second pad portions that protrude from the insulating layer; mounting a passive device that includes a plurality of bump structures on the second pad portion of the second wiring pattern layer, and forming an underfill resin that surrounds side surfaces of the plurality of second bump structures.

DETAILED DESCRIPTION

The term "about" as used herein is inclusive of the stated value and means within an acceptable range of deviation for the particular value as determined by one of ordinary skill in the art, considering the measurement in question and the error associated with measurement of the particular quantity. For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

Hereinafter, embodiments of the present disclosure will be described as follows with reference to the accompanying drawings.

Figure 1A:
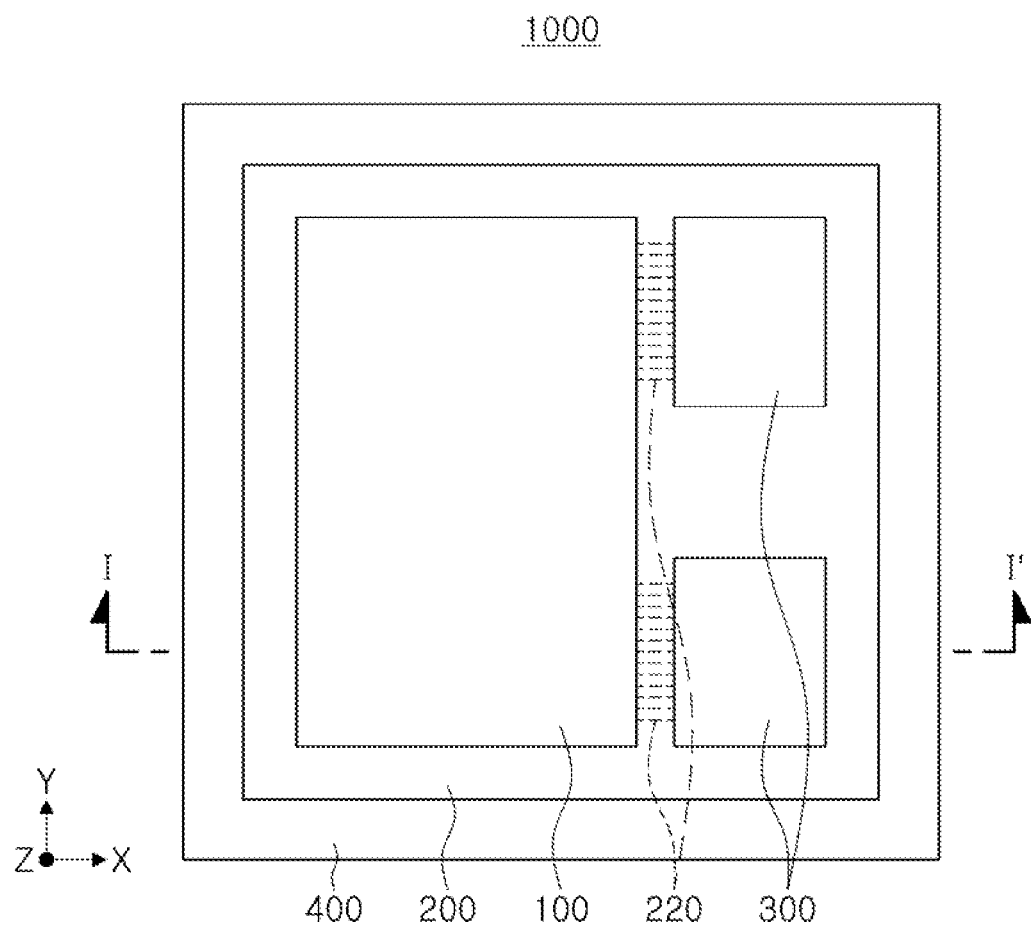
FIG. 1A is a plan diagram of a semiconductor package according to an embodiment of the present disclosure.
Figure 1B:
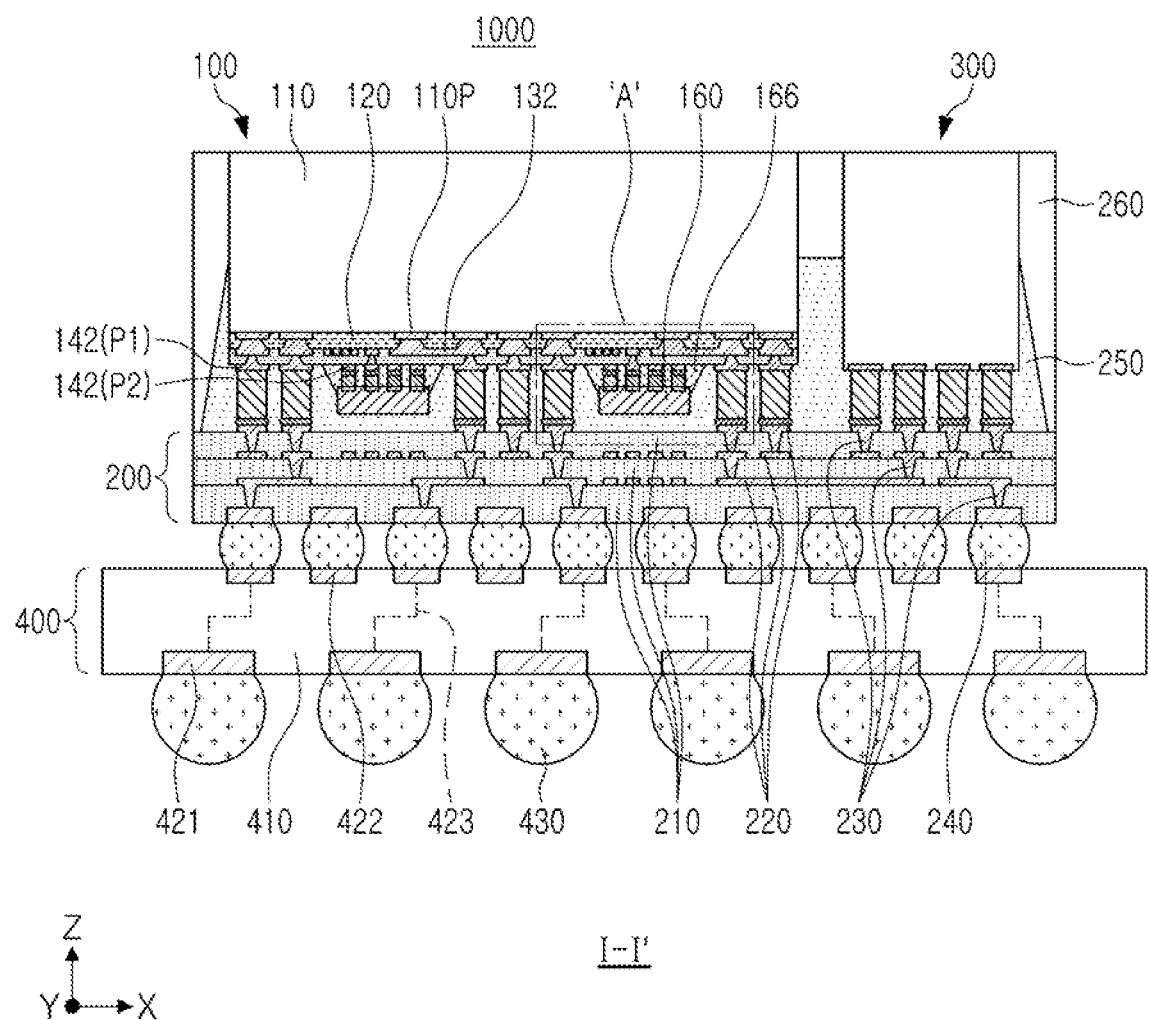
FIG. 1B is a cross-sectional view of a semiconductor package illustrated in FIG. 1A.
Figure 1C:
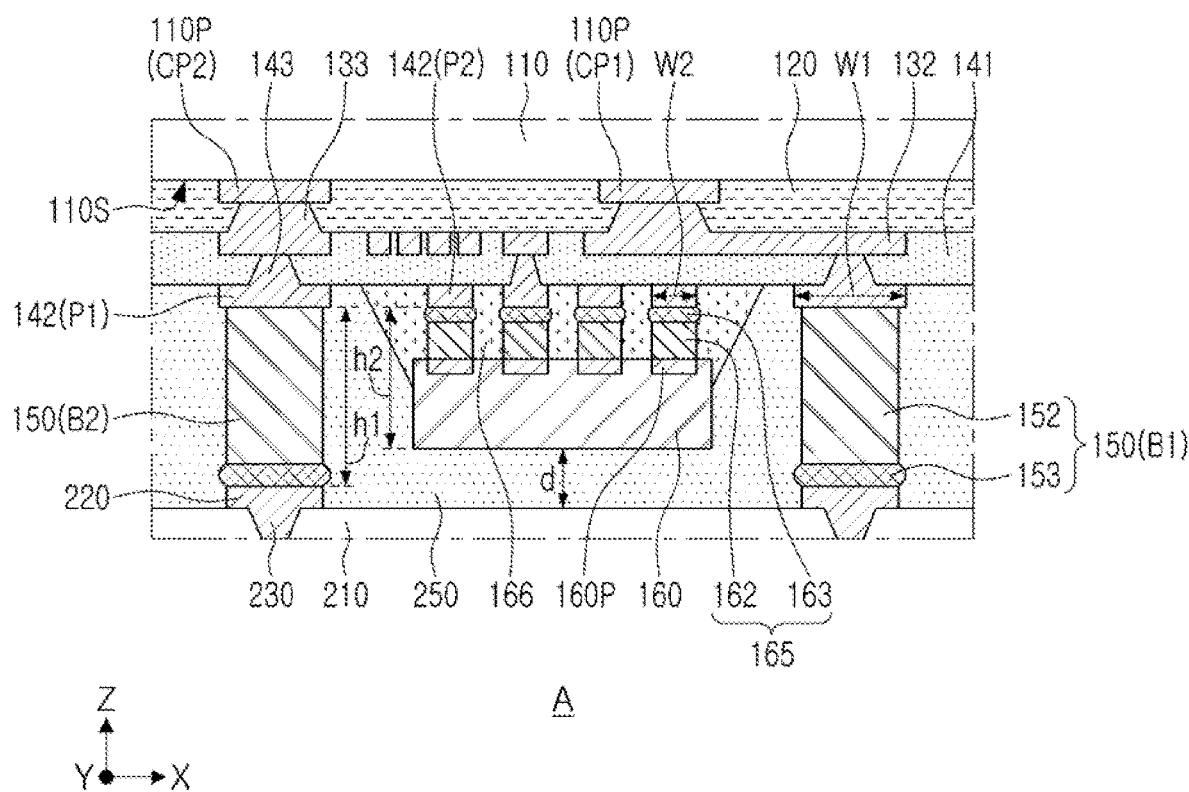
FIG. 1C is an enlarged view of region "A" in FIG. 1B.

FIG. 1 is a plan diagram of a semiconductor package 1000 in an embodiment. FIG. 1B is a cross-sectional view of a semiconductor package 1000 illustrated in FIG. 1A. FIG. 1C is an enlarged view of region "A" in FIG. 1B. In FIG. 1A, a portion of the elements, an underfill resin 250 and an encapsulant 260, are not illustrated, for clarity of illustration.

Referring to FIGS. 1A to 1C, a semiconductor package 1000 in an embodiment includes a semiconductor chip 100 in which a passive device 160 is mounted on an active surface 110S, and first and/or second underfill resins 166 and 250 that fill a region between the passive device 160 and a bump structure 150. In addition, the semiconductor package 1000 in an embodiment further includes a redistribution substrate 200, a chip structure 300, and/or a base substrate 400. In an embodiment, as a connection path between the passive device 160, such as a capacitor, and the semiconductor chip 100 is reduced, the semiconductor package 1000 with improved power integrity (PI) properties is provided in which voltage noise is effectively removed without an expensive substrate, such as a silicon interposer, that includes an integrated stacked capacitor (ISC).

In an embodiment, a wiring structure is included that secures a region on which at least one passive device 160 is mounted without changing the design of the semiconductor chip 100 or the layout design of a connection pad 110P manufactured in a fab. For example, the semiconductor chip 100 in an embodiment includes a body 110 that has an active surface 110S that faces the redistribution substrate 200, a first connection pad CP1 and a second connection pad CP2 spaced apart from each other below the active surface 110S, a first bump structure B1 and the passive device 160 electrically connected to the first connection pad CP1 on a lower level from the first connection pad CP1, and a second bump structure B2 electrically connected to the second connection pad CP2 on a lower level from the second connection pad CP2. The connection pads 110P are denoted as the first connection pad CP1 and the second connection pad CP2 to distinguish the first connection pad CP1, which overlaps the passive device 160. For example, the first connection pad CP1 overlaps the passive device 160 in the vertical direction (Z-axis direction), and the second connection pad CP2 does not overlap the passive device 160 in the vertical direction (Z-axis direction).

In addition, the semiconductor chip 100 in an embodiment further includes first and second wiring pattern layers 132 and 142 that electrically connect the first and second connection pads CP1 and CP2 to the passive device 160 and to the first and second bump structures B1 and B2. The second wiring pattern layer 142 includes a first pad P1 and a second pad P2. For example, the first bump structure B1 is electrically connected to the first connection pad CP1 through the first pad P1 and the first wiring pattern layer 132 below the first pad P1, and the passive device 160 is electrically connected to the first connection pad CP1 through the second pad P2 and the first wiring pattern layer 132 below the second pad P2. In embodiments, the passive device 160 is also electrically connected to the second connection pads CP2, which do not overlap each other.

The body 110 includes a semiconductor substrate that includes a semiconductor element such as silicon or germanium, or a compound semiconductor such as silicon carbide (SiC), gallium arsenide (GaAs), indium arsenide (InAs), or indium phosphide (InP), and an integrated circuit (IC) disposed on the semiconductor substrate. A connection pad 110P that is electrically connected to an integrated circuit is disposed on the active surface 110S of the body 110. The connection pad 110P includes a conductive material, such as a metal such as aluminum (Al). An insulating film such as a silicon oxide film, a silicon nitride film, or a silicon oxynitride film, is formed on an upper surface and a lower surface of the body 110. For example, the connection pad 110P is disposed on a silicon nitride layer. For example, the semiconductor chip 100 includes a logic chip, such as a central processor (CPU), a graphics processor (GPU), a field programmable gate array (FPGA), a digital signal processor (DSP), a cryptographic processor, a microprocessor, a microcontroller, an analog-to-digital converter, or an application-specific ICs (ASICs).

A passivation layer 120 is disposed below the active surface 110S, and has an opening that exposes at least a portion of the connection pad 110P. The passivation layer 120 protects the semiconductor chip 100 as it goes through a process at a wafer level, and protects the semiconductor chip 100 from mechanical and thermal stress applied in a packaging process. The passivation layer 120 includes an insulating material that is heat resistant, chemically resistant, and has good mechanical properties, electrical properties, and etc. For example, the passivation layer 120 includes a photosensitive polyimide (PSPI).

The first wiring pattern layer 132 is disposed below the passivation layer 120, and is electrically connected to the connection pad 110P through a first wiring via 133 formed in an opening of the passivation layer 120. The first wiring pattern layer 132 redistributes a portion of the connection pads 110P to an external side of a mounting area of the passive device 160. In addition, the first wiring pattern layer 132 electrically connects connection terminals 160P of the passive device 160 to the connection pad 110P. The first wiring pattern layer 132 includes a metal, such as at least one of copper (Cu), aluminum (Al), nickel (Ni), silver (Ag), gold (Au), platinum (Pt), or at least one of tin (Sn), lead (Pb), titanium (Ti), chromium (Cr), palladium (Pd), indium (In), zinc (Zn) or carbon (C), or an alloy that includes two or more thereof. FIG. 1C shows the first wiring pattern layer 132 as being configured as a single layer, but in embodiments, the first wiring pattern layer 13 includes a plurality of wiring pattern layers.

A second insulating layer 141 covers at least a portion of the first wiring pattern layer 132, and includes a photosensitive resin such as a photoimageable dielectric (PID). In this case, the insulating layer 141 has a thickness less than that of an example in which other insulating materials, such as prepreg, Ajinomoto build-up film (ABF), FR-4, or bismaleimide triazine (BT), etc., are used, and a pattern layer that has vias and a fine pitch can be formed.

The second wiring pattern layer 142 is disposed below the second insulating layer 141, and is electrically connected to the wiring pattern layer 132 through a second wiring via 143 that penetrates the second insulating layer 141.

In an embodiment, the connection pad 110P disposed in a mounting area of the passive device 160 is redistributed to the position of the first pad P1 using the first wiring pattern layer 132, and the second pad P2 is disposed in the mounting area of the passive device 160. The first pad P1 and the second pad P2 are separated from each other in a horizontal direction, (X-axis or Y-axis direction), the first pad P1 is electrically connected to the redistribution substrate 200 through the first bump structure 150, and the second pad P2 is electrically connected to the passive device 160 through a third bump structure 165. Accordingly, the first pad P1 does not overlap the passive device 160 in the vertical direction (Z-axis direction), whereas the second pads P2 and at least a portion of the connection pads 110P overlap the passive device 160 in the vertical direction (Z-axis direction). In addition, the second pad P2 have a size that corresponds to the size of a connection terminal 160P of the passive device 160, such that a width W2 of the second pad P2 is less than a width W1 of the first pad P1. In other words, the width W1 of the first pad P1 is greater than the width W2 of the second pad P2. In addition, FIG. 1C shows the second wiring pattern layer 142 with only the first pad P1 and the second pad P2, but in embodiments, the second wiring pattern layer 142 further includes a pattern portion that extends in the horizontal direction (X-axis or Y-axis direction), as shown in FIG. 2B. As described above, by mounting the passive device 160 on the active surface 110S of the semiconductor chip 100 using the first wiring pattern layer 132 and the second wiring pattern layer 142, a connection path between the passive device 160 and the semiconductor chip 100 is reduced, and PI properties of the semiconductor package 1000 are improved.

The first bump structure 150 is disposed below the first pad P1 and transmits a signal of the semiconductor chip 100 to an external entity, or transmits a signal and power received from an external entity to the semiconductor chip 100. The first bump structure 150 has a predetermined height to secure a mounting space for the passive device 160. For example, the first bump structure 150 includes a pillar portion 152 with one end connected to the first pad P1, and a solder portion 153 disposed on the other end of the pillar portion 152. The pillar portion 152 has a pillar shape formed of a metal such as copper (Cu), and occupies most of the height of the first bump structure 150. The solder portion 152 has a spherical shape or a ball shape formed of a low-melting-point metal such as tin (Sn), indium (In), bismuth (Bi), antimony (Sb), copper (Cu), silver (Ag), zinc (Zn), lead (Pb), or an alloy thereof, such as Sn—Ag—Cu.

The passive device 160 is disposed below the second pad P2 and is electrically connected to the connection pad 110P through the second pad P2 and the first wiring pattern layer 132. The passive device 160 includes the connection terminal 160P and a third bump structure 165 that connects the connection terminal 160P to the second pad P2. The third bump structure 165 includes a pillar portion 162 and a solder portion 163 similar to the above-described first bump structure 150. The passive device 160 may include, for example, a capacitor, an inductor, or beads. In an embodiment, the passive device 160 is configured as a silicon capacitor in the form of a chip that has a high capacitance. In an embodiment, at least one passive device 160 is directly mounted on the lower surface of the semiconductor chip 100 such that signal integrity (SI) and/or power integrity (PI) properties of the semiconductor package are improved. Accordingly, the passive device 160 has a thickness equal to or less than that of the first bump structure 150 disposed below the semiconductor chip 100.

In an embodiment, a height h2 in a direction (Z-axis direction) perpendicular to the active surface 110S of the passive device 160 is less than a height h1 of the first bump structure 150. Accordingly, the passive device 160 is spaced apart from the upper surface of the redistribution substrate 200 by a predetermined distance d. The spacing distance d between the passive device 160 and the redistribution substrate 200 may be about 20 μm or more, or about 30 μm or more, and is, for example, in a range of from about 20 μm to about 50 μm. In an example, the height h2 of the passive device 160 may be about 100 μm or less, or about 80 μm or less, and is, for example, in a range of from about 100 μm to about 30 μm or in a range of from about 80 μm to about 40 μm. In addition, the height h1 of the first bump structure 150 may be about 80 μm or more, or about 90 μm or more, and is, for example, in a range of from about 80 μm to 120 μm, or in the range of from about 90 μm to about 120 μm.

The semiconductor package 1000 in an embodiment includes a first underfill resin 166 that fastens the passive device 160 to the semiconductor chip 100 and protects the passive device 160, and/or a second underfill resin 250 that fastens the semiconductor chip 100 to the redistribution substrate 200 and protects the passive device 160 and the first bump structure 150. The first underfill resin 166 fills a region between at least one passive device 160 and the semiconductor chip 100 or the second insulating layer 141 and surrounds a side surface of the third bump structure 165. The second underfill resin 250 is disposed between the redistribution substrate 200 and the semiconductor chip 100, and surrounds a side surface of the first bump structure 150, a side surface of the passive device 160, and a side surface of the first underfill resin 166. In an embodiment, the first and second underfill resins 166 and 250 include the same type of insulating resin. Accordingly, a boundary between the first and second underfill resins 166 and 250 is not distinct. In embodiments, the second underfill resin 250 is a molded underfill (MUF) formed of the same material as an encapsulant 260. In this case, a boundary between the second underfill resin 250 and the encapsulant 260 is not distinct.

The redistribution substrate 200 is a support substrate on which the semiconductor chip 100 and/or the chip structure 300 is mounted, and includes one or more first insulating layers 210, one or more redistribution pattern layers 220 disposed on the one or more first insulating layers 210, respectively, and a redistribution via 230 that penetrates the one or more first insulating layers 210 and electrically connects to the one or more redistribution pattern layers 220. A first connection bump 240 that is electrically connected to the redistribution pattern layer 220 is disposed on a lower surface of the redistribution substrate 200. The first connection bump 240 is disposed on a lowermost redistribution pattern layer and includes tin (Sn) or an alloy that includes tin (Sn), such as Sn—Ag—Cu.

The first insulating layer 210 includes an insulating resin. The insulating resin may include a thermosetting resin such as an epoxy resin, a thermoplastic resin such as a polyimide resin, or a resin in which an inorganic filler and/or a glass fiber, a glass cloth or a glass fabric is impregnated in the thermosetting resin or the thermoplastic resin, such as prepreg, ABF, FR-4, BT, etc. In an embodiment, the first insulating layer 210 includes a photosensitive resin such as PID. The first insulating layer 210 includes a plurality of first insulating layers 210 stacked in a vertical direction (Z-axis direction). Depending on a process, a boundary between the plurality of first insulating layers 210 may be indistinct. Although only three insulating layers 210 are illustrated in the drawings for ease of illustration, embodiments thereof are not limited thereto. In embodiments, the redistribution substrate 200 includes four or more first insulating layers 210.

The redistribution pattern layer 220 includes a metal such as, copper (Cu), aluminum (Al), silver (Ag), tin (Sn), gold (Au), nickel (Ni), lead (Pb), titanium (Ti), or an alloy thereof. The redistribution pattern layer 220 may include, for example, a ground (GrouND: GND) pattern, a power (PoWeR: PWR) pattern, or a signal (S) pattern. The signal (S) pattern provides a path through which various signals other than a ground (GND) pattern or a power (PWR) pattern, such as a data signal, are transmitted/received. The redistribution pattern layer 220 includes a plurality of redistribution pattern layers 220 disposed on the plurality of first insulating layers 210, respectively. The plurality of redistribution pattern layers 220 are electrically connected to each other through the redistribution vias 230. In an embodiment, the lowermost redistribution pattern layer in contact with the first connection bump 240 has a thickness greater than that of the redistribution pattern layers disposed thereon. The number of the redistribution pattern layers 220 is determined based on the number of the first insulating layers 210, and may include more or fewer layers than the examples illustrated in the drawings.

The redistribution vias 230 are electrically connected to the redistribution pattern layers 220 and include a signal via, a ground via, and a power via. The redistribution vias 230 include a metal such as copper (Cu), aluminum (Al), silver (Ag), tin (Sn), gold (Au), nickel (Ni), lead (Pb), or titanium (Ti), or an alloy thereof. The redistribution via 230 is a filled via in which a metal fills a via hole or a conformal via in which a metal is formed along an inner wall of the via hole.

The encapsulant 260 is disposed on the redistribution substrate 200 and encapsulates at least a portion of each of the semiconductor chip 100 and/or the chip structure 300. In an embodiment, the encapsulant 260 covers a side surface of each of the semiconductor chip 100 and the chip structure 300, and exposes an upper surface of each of the semiconductor chip 100 and the chip structure 300. The encapsulant 260 includes, for example, an epoxy mold compound (EMC), but the material of the encapsulant 260 is not limited to any particular material. In embodiments, instead of the second underfill resin 250, the encapsulant 260 fills a lower portion of the semiconductor chip 100 and a lower portion of the chip structure 300.

The chip structure 300 is disposed adjacent to the semiconductor chip 100 on the redistribution substrate 200 and is electrically connected to the semiconductor chip 100 through the redistribution pattern layer 220. The chip structure 300 may be a memory device that includes at least one memory chip. A memory chip may be, for example, a volatile memory device such as a dynamic RAM (DRAM) or a static RAM (SRAM), etc., or a nonvolatile memory device such as a phase change RAM (PRAM), a magnetic RAM (MRAM), a resistive RAM (RRAM), or a flash memory, etc. In an embodiment, the chip structure 300 is a high-performance memory device such as a high bandwidth memory (HBM) or a hybrid memory cubic (HMC), etc. A plurality of chip structures 300 may be disposed around the semiconductor chip 100. The plurality of chip structures 300 is not limited to the number of chip structures 300 illustrated in FIG. 1A, and may include a greater or a lesser number of chip structures 300 than the examples illustrated in FIG. 1A.

The base substrate 400 is a support substrate on which the redistribution substrate 200 is mounted, and includes a lower pad 421 on a lower surface of the substrate body 410, an upper pad 422 on an upper surface of the substrate body 410, and a redistribution circuit 423 that electrically connects the lower pad 421 to the upper pad 422. The base substrate 400 is a substrate for a semiconductor package that includes a printed circuit board (PCB), a ceramic substrate, a glass substrate, or a tape wiring board, etc. The substrate body 410 includes different materials based on the type of the substrate. For example, when the base substrate 400 is a printed circuit board, the substrate body 410 is implemented by a copper clad stack or may have additional wiring layers stacked on one side or both surfaces of the copper clad stack. A solder resist layer is formed on each of the lower and upper surfaces of the base substrate 400. The lower and upper pads 421 and 422 and the redistribution circuit 423 form an electrical path that connects the lower surface of the base substrate 400 to the upper surface. The redistribution circuit 423 includes multiple redistribution layers and vias that connect the redistribution layers to each other. A second connection bump 430 connected to the lower pad 421 is disposed on the lower surface of the base substrate 400. The second connection bump 430 includes tin (Sn) or an alloy that includes tin (Sn), such as Sn—Ag—Cu, similar to the first connection bump 240.

As described above, in an embodiment, by directly mounting at least one or more passive devices 160 on the active surface 110S of the semiconductor chip 100 using the first wiring pattern layer 132 and the second wiring pattern layer 142, a connection path between the passive device 160 and the semiconductor chip 100 is reduced and PI properties of the semiconductor package 1000 are improved. Hereinafter, the shape of the first and second wiring pattern layers 132 and 142 and the arrangement relationship between the connection pad 110P and the first and second pads P1 and P2 will be described with reference to FIGS. 2A and 2B.

Figure 2A:
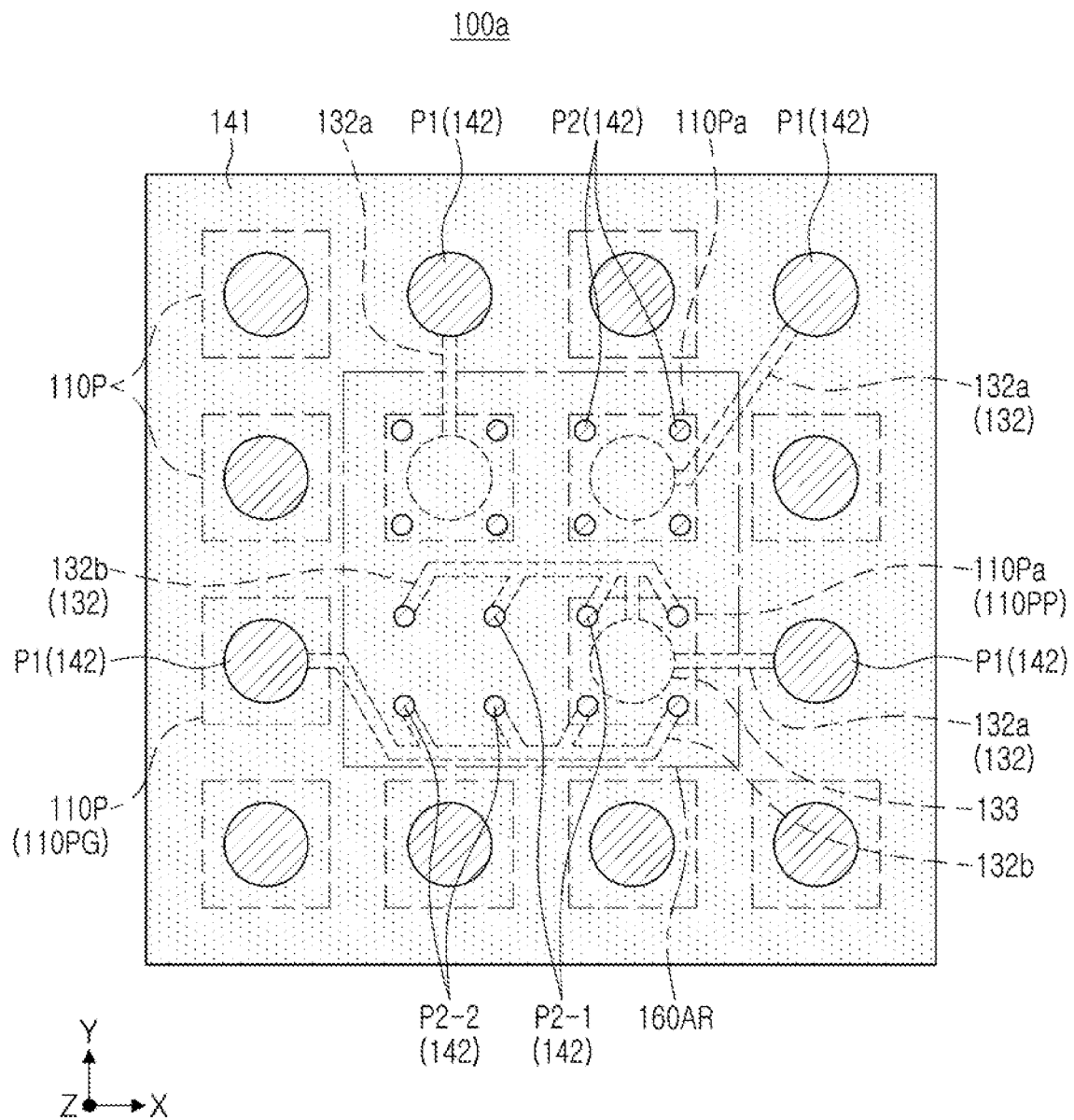
FIGS. 2A and 2B are plan views of a region of a semiconductor chip in a semiconductor package according to an embodiment of the present disclosure.
Figure 2B:
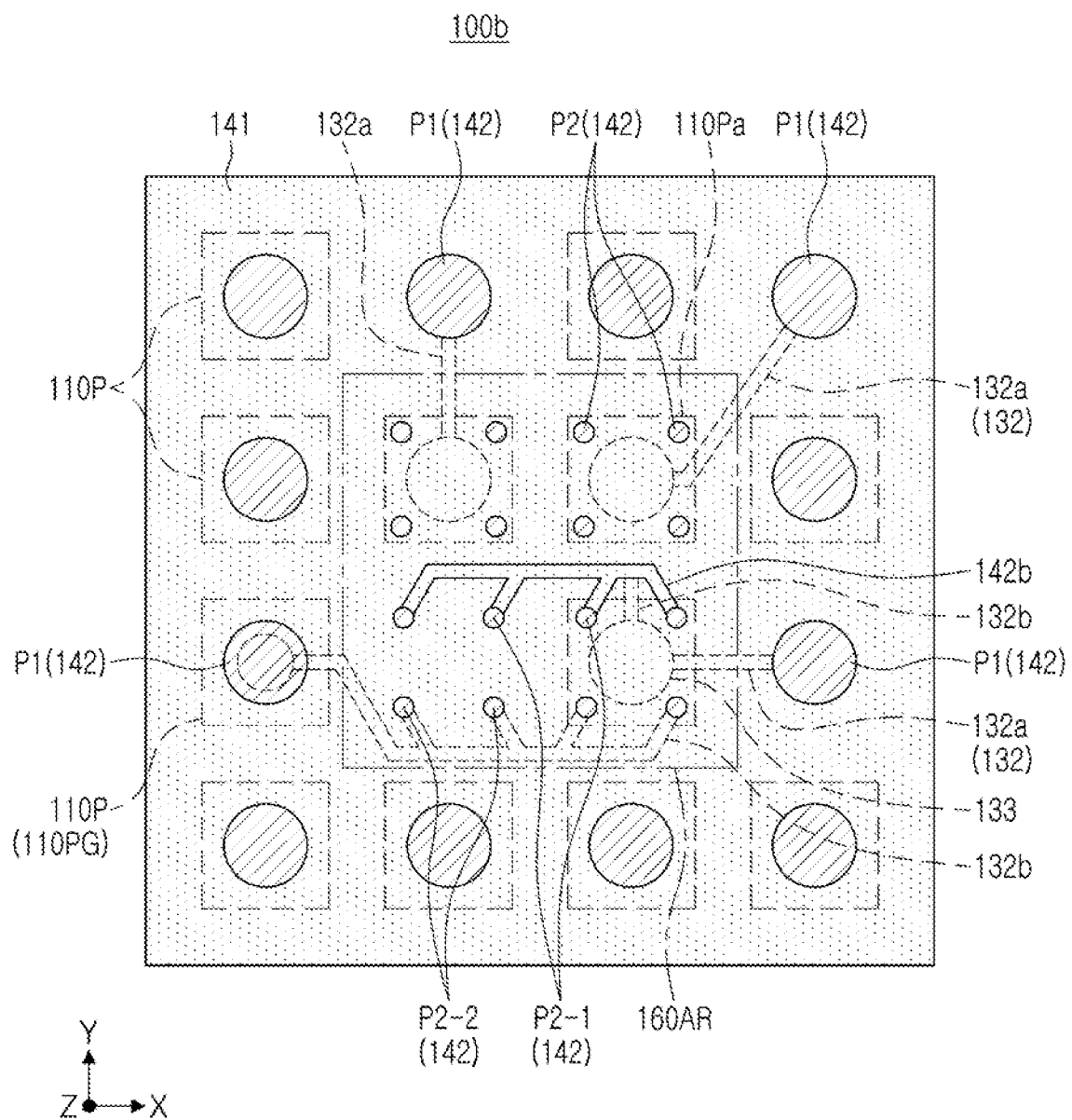

FIGS. 2A and 2B are plan views of a region of semiconductor chips 100a and 100b in a semiconductor package according to an embodiment. FIGS. 2A and 2B illustrate a connection pad 110P, first and second pads P1 and P2, and first and second wiring pattern layers 132 and 142 that connect the above elements on an X-Y plane of the semiconductor chips 100a and 100b. FIGS. 2A and 2B schematically illustrate a connection relationship of a portion of the plurality of connection pads 110P and the plurality of first and second pads P1 and P2.

Referring to FIG. 2A, according to an embodiment, a semiconductor chip 100a includes a plurality of connection pads 110P, a plurality of first pads P1, a plurality of second pads P2, and a first interconnection pattern layer 132 that electrically connecting the aforementioned elements. For example, the semiconductor chip 100a includes a plurality of connection pads 110P, a first wiring pattern layer 132 that is electrically connected to the plurality of connection pads 110P through a first wiring via 133, and a second wiring pattern layer 142 that includes a plurality of first pads P1 and a plurality of second pads P2 electrically connected to the first wiring pattern layer 132 through a second wiring via 143, shown in FIG. 1C. A plurality of bump structures 150, shown in FIG. 1C, are disposed on the plurality of first pads P1, respectively, and at least one passive device 160, shown in FIG. 1C, is disposed on the plurality of second pads P2. In an embodiment, the plurality of second pads P2 are disposed in an area 160AR, hereinafter referred to as a mounting area, in which one passive device is disposed. In addition, the first wiring pattern layer 132 is disposed on a level between the connection pad 110P and the second wiring pattern layer 142.

In an embodiment, at least a portion of the plurality of connection pads 110P disposed in the mounting area 160AR of the passive device are redistributed to an external side of the mounting area 160AR of the passive device using the first wiring pattern layer 132, which has a fine pitch. Accordingly, at least a portion of the connection pads 110Pa are disposed on an internal side of the mounting area 160AR of the passive device in the vertical direction (Z-axis direction), and the plurality of first pads P1 are disposed on an external side of the mounting area 160AR of the passive device. In addition, since the plurality of second pads P2 are disposed in the mounting area 160AR of the passive device, the plurality of second pads P2 overlap the passive device 160, as shown in FIG. 1C, that is mounted on the plurality of second pads P2 in a vertical direction (Z-axis direction).

In an embodiment, the first wiring pattern layer 132 includes a first pattern portion 132a that connects at least a portion of the connection pads 110Pa to a corresponding first pad P1, and a second pattern portion 132b that connects the plurality of second pads P2 to at least a portion of the plurality of connection pads 110P. The connection pads 110P to which the plurality of second pads P2 are connected are not limited to those disposed in the mounting area 160AR of the passive device, and may include connection pads 110P or 110Pa, depending on the purpose of the passive device mounted on the plurality of second pads P2. The first pattern portions 132a extend in a horizontal direction such that one end thereof is connected to the connection pad 110Pa in the mounting area 160AR and the other end is connected to the first pad P1, and the second pattern portions 132b extend in a horizontal direction such that one end is connected to the connection pads 110P or 110Pa and the other end is connected to the second pad P2. The first and second pattern portions 132a and 132b are formed of fine-pitch patterns. For example, a size of a line and space of the first and second pattern portions 132b may be about 10 μm/10 μm or less, about 5 μm/5 μm or less, or about 2 μm/2 μm or less. "Line" is defined as a minimum line width of a pattern, and "space" is defined as a minimum spacing distance between adjacent patterns.

As described above, by redistributing the connection pad 110Pa disposed in the mounting area 160AR of the passive device to the position of the first pad P1, and securing the mounting area 160AR of the passive device, the passive device is directly mounted on the semiconductor chip without changing the design of the semiconductor chip manufactured in the fab. Accordingly, in an embodiment, SI and/or PI properties of a semiconductor package improve without an expensive substrate, such as a silicon interposer. For example, the plurality of connection pads 110P includes a power pad 110PP and a ground pad 110PG, and the plurality of second pads P2 includes a first group of second pads P2-1 connected to the power pads 110PP and a second group of second pads P2-2 connected to the ground pada 110PG. In this case, the passive device is connected to the semiconductor chip through the second pads P2-1 and P2-2 of the first and second groups such that voltage noise is removed and PI properties are improved.

Referring to FIG. 2B, according to an embodiment, a semiconductor chip 100b further includes a second wiring pattern layer 142 that further includes a pattern portion 142b that redistributes at least a portion of the second pads P2, different from the semiconductor chip 100a in FIG. 2A. In an embodiment, the second wiring pattern layer 142 includes the pattern portion 142b, which reduces congestion of the first wiring pattern layer 132. In addition, in this case, the first wiring pattern layer 132 redistributes the connection pad 110Pa in the mounting area 160AR of the passive device and connects the second pads P2 to the connection pad 110P. In embodiments, an additional protective layer that covers the pattern portion 142b is further disposed on the second wiring pattern layer 142.

The design of the first and second wiring pattern layers 132 and 142 is not limited to the embodiments illustrated in FIGS. 2A and 2B, and the number of the first and second wiring pattern layers 132 and 142 may be greater than the embodiments illustrated in the drawings.

Figure 3:
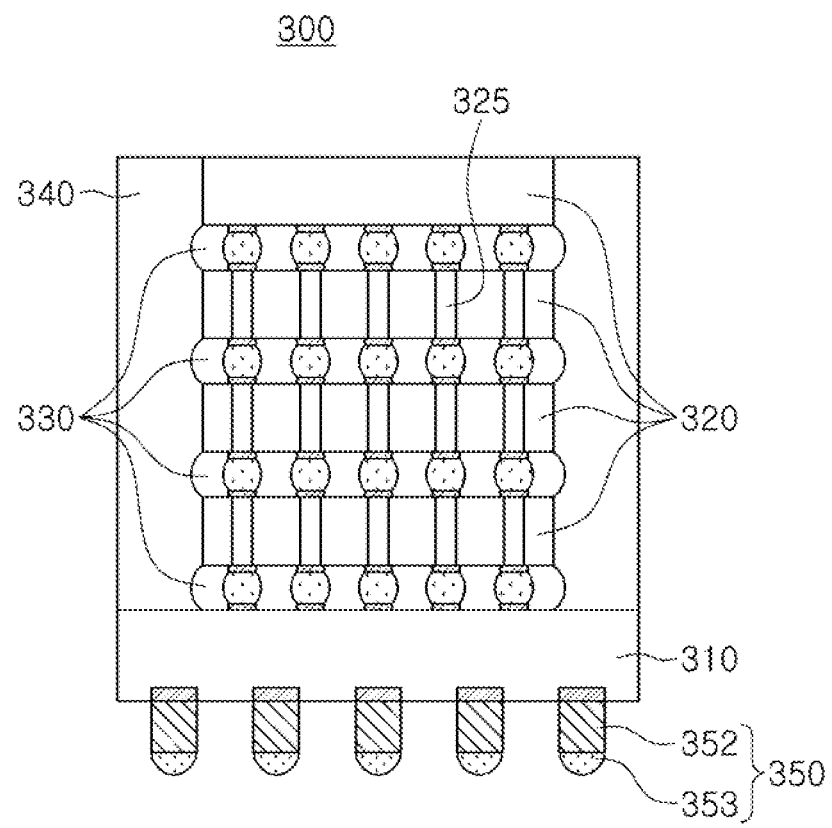
FIG. 3 is a cross-sectional view of an example of a chip structure applicable to a semiconductor package illustrated in FIG. 1A.

FIG. 3 is a cross-sectional view of an example of a chip structure 300 applicable to the semiconductor package 1000 illustrated in FIG. 1A.

Referring to FIG. 3, in an embodiment, a chip structure 300 includes a base chip 310 and a plurality of memory chips 320. The number of the plurality of memory chips 320 stacked on the base chip 310 is not limited to the embodiment illustrated in the drawings, and for example, 3 or fewer or 5 or more memory chips 320 may be stacked on the base chip 310. The base chip 310 is formed from a semiconductor material such as a silicon (Si) wafer, and includes a through silicon via (TSV) that penetrates the body. However, embodiments thereof are not limited thereto, and in other embodiments, the base chip 310 is implemented as a PCB or a glass substrate that does not include a semiconductor material. The base chip 310 is a buffer die that may receive from an external entity at least one of a control signal, a power signal, or a ground signal to operate the plurality of memory chips 320, may receive from an external entity a data signal stored in the plurality of memory chips 320, or may transmit data retrieved from the plurality of memory chips 320 to an external entity.

The plurality of memory chips 320 are stacked on the base chip 310 in the vertical direction (Z direction) and are connected to each other through a TSV 325 that penetrates a portion of the memory chips 320. The plurality of memory chips 320 may include a volatile memory device such as a DRAM or a static RAM (SRAM), or a nonvolatile memory device such as a PRAM, a MRAM, a RRAM, or a flash memory device. The plurality of memory chips 320 store or output data based on a signal from the base chip 310. A conductive bump and an insulating film 330 that surround the conductive bump are disposed between the plurality of memory chips 320. In addition, the plurality of memory chips 320 are surrounded by the molding member 340. The molding member 340 includes an insulating resin, such as prepreg, ABF, FR-4, BT, or EMC, etc. A third bump structure 350 that includes a pillar portion 352 and a solder portion 353 is disposed below the base chip 310. In embodiments, the pillar portion 352 or the solder portion 353 may be omitted.

Figure 4:
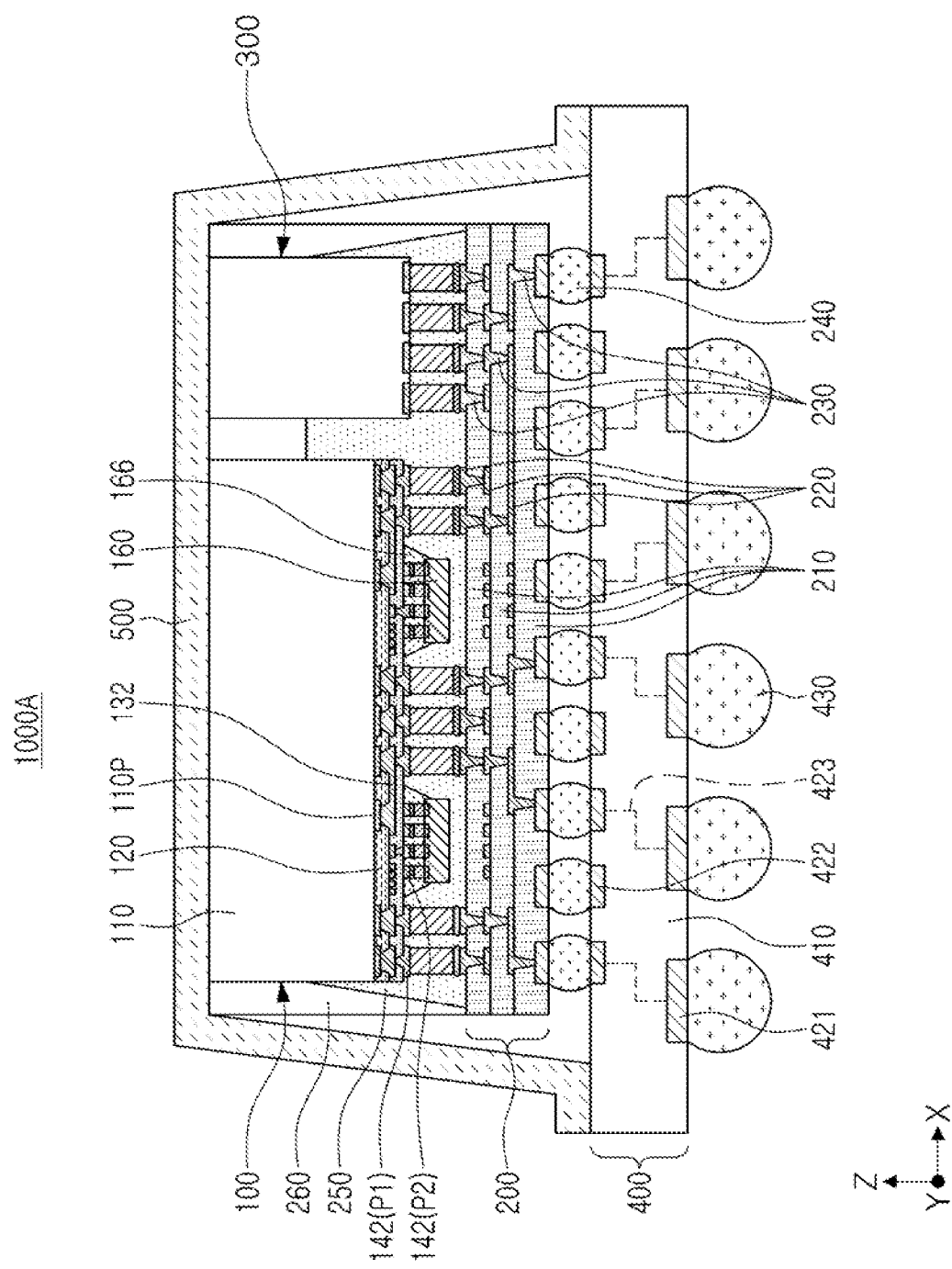
FIG. 4 is a cross-sectional view of a semiconductor package according to an embodiment of the present disclosure.

FIG. 4 is a cross-sectional view of a semiconductor package 1000A in an embodiment.

Referring to FIG. 4, a semiconductor package 1000A in an embodiment is similar to an example described with reference to FIGS. 1A and 1C, except that it further includes a heat dissipation structure 500 disposed on the base substrate 400 that covers the semiconductor chip 100 and the chip structure 300.

The heat dissipation structure 500 is fastened to the base substrate 400 by an adhesive member, controls warpage of the semiconductor package 1000A, and dissipates heat generated in the semiconductor chip 100 and the chip structure 300. The heat dissipation structure 500 completely covers the semiconductor chip 100, the chip structure 300, and the redistribution substrate 200, but embodiments thereof are not limited thereto. In other embodiments, the heat dissipation structure 500 has a plate shape that covers only upper surfaces of the semiconductor chip 100 and the chip structure 300. The heat dissipation structure 500 includes a thermally conductive material, such as aluminum (Al), gold (Au), silver (Ag), copper (Cu), iron (Fe), graphite, or graphene, etc. An adhesive member may be interposed between the heat dissipation structure 500 and the semiconductor chip 100. The adhesive member includes, for example, a thermally conductive adhesive tape, thermally conductive grease, or a thermally conductive adhesive, etc.

Figure 5:
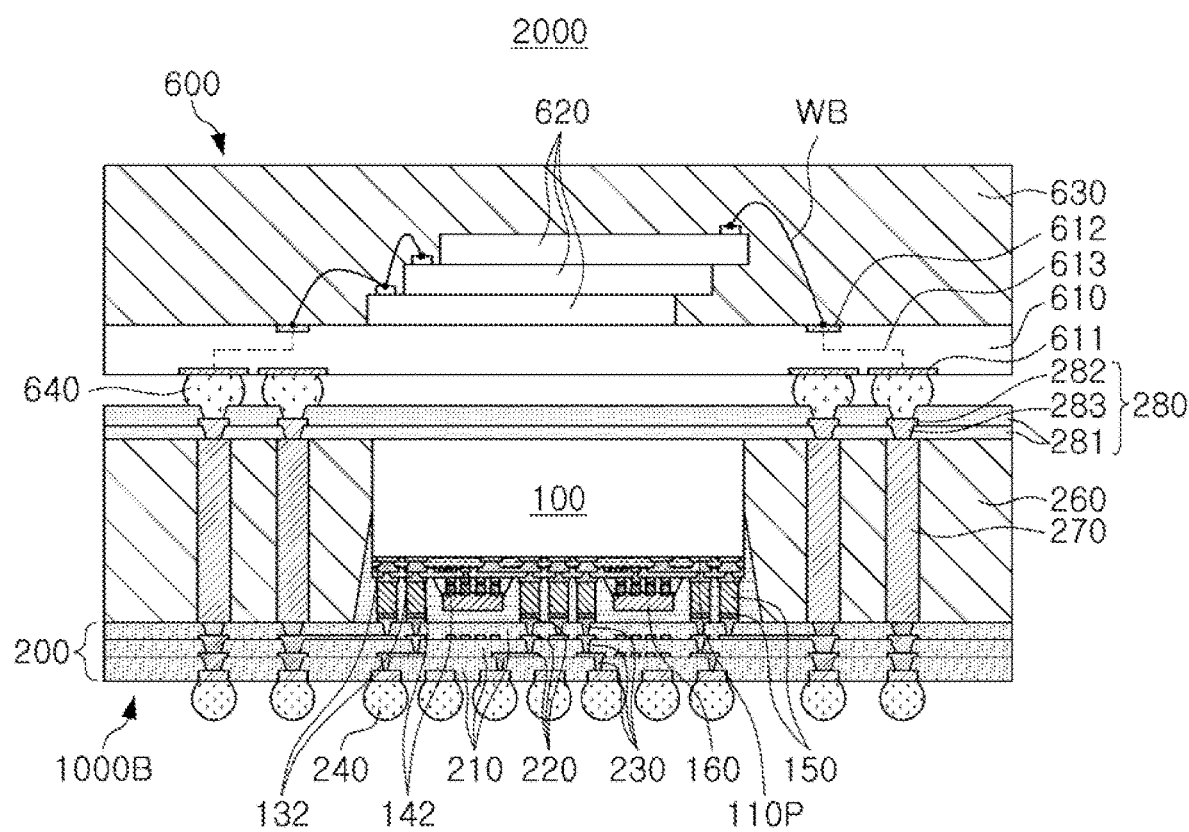
FIG. 5 is a cross-sectional view of a semiconductor package according to an embodiment of the present disclosure.

FIG. 5 is a cross-sectional view of a semiconductor package 2000 in an embodiment.

Referring to FIG. 5, a semiconductor package 2000 in an embodiment includes a first package 1000B and a second package 600. Different from the semiconductor package 1000 illustrated in FIGS. 1A and 1B, the first package 1000B does not include the base substrate 400 and the chip structure 300, but further includes a through via 270 that penetrates the encapsulant 260 and a rear redistribution structure 280. In addition, the first semiconductor chip 100 embedded in the first package 1000B has the same characteristics as those of the semiconductor chip 100 described with reference to FIGS. 1A to 2B. The through via 270 is electrically connected to the redistribution pattern layer 220. The through via 270 has a post shape through which a conductor penetrates at least a portion of the encapsulant 260. The through via 270 provides an electrical connection path that penetrates the first package 1000B in a vertical direction.

The rear redistribution structure 280 includes a rear insulating layer 281, a rear redistribution pattern layer 282 disposed on the rear insulating layer 281, and a rear redistribution via 283 that penetrates the rear insulating layer 281 and connects the rear redistribution pattern layer 282 to the through via 270. The rear insulating layer 281 covers an upper surface of the through via 270 exposed on the upper surface of the encapsulant 260 and an upper surface of the first semiconductor chip 100. The rear insulating layer 281 includes an insulating resin similar to the insulating layer 210 of the redistribution substrate 200, such as PID. The rear redistribution pattern layer 282 and the rear redistribution via 283 include a conductive material similar to that of the redistribution pattern layer 220 and the redistribution via 230 of the redistribution substrate 200.

The second package 600 includes a second redistribution substrate 610, a second semiconductor chip 620, and a second encapsulant 630. The second redistribution substrate 610 includes redistribution pads 611 and 612 that are electrically connected to external entities on a lower surface and an upper surface thereof, respectively. In addition, the second redistribution substrate 610 includes a redistribution circuit 613 connected to the redistribution pads 611 and 612 therein.

The second semiconductor chip 620 is mounted on the second redistribution substrate 610 by wire bonding or flip chip bonding. For example, the plurality of second semiconductor chips 620 are vertically stacked on the second redistribution substrate 610, and are electrically connected to the redistribution pads 612 of the second redistribution substrate 610 by a bonding wire WB. In an embodiment, the second semiconductor chips 620 include a memory chip, and the first semiconductor chip 100 includes an application processor (AP) chip.

The second encapsulant 630 include the same material or a material similar to that of the encapsulant 260 of the first package 1000B. The second package 600 is physically and electrically connected to the first package 1000B by the metal bump 640. The metal bump 640 is electrically connected to the redistribution circuit 613 in the second redistribution substrate 610 through the redistribution pad 611 on the lower surface of the second redistribution substrate 610. The metal bump 640 is formed of a low-melting-point metal, such as tin (Sn) or an alloy that includes tin (Sn).

FIGS. 6A to 6E are cross-sectional views that illustrate a method of manufacturing a semiconductor package according to an embodiment. FIGS. 6A to 6E sequentially illustrate a manufacturing process of the first and second wiring pattern layers 132 and 142 illustrated in FIG. 1C. FIGS. 6A to 6E illustrate seed layers of the first and second wiring pattern layers 132 and 142 not shown in FIG. 1C for ease of description.

Figure 6A:
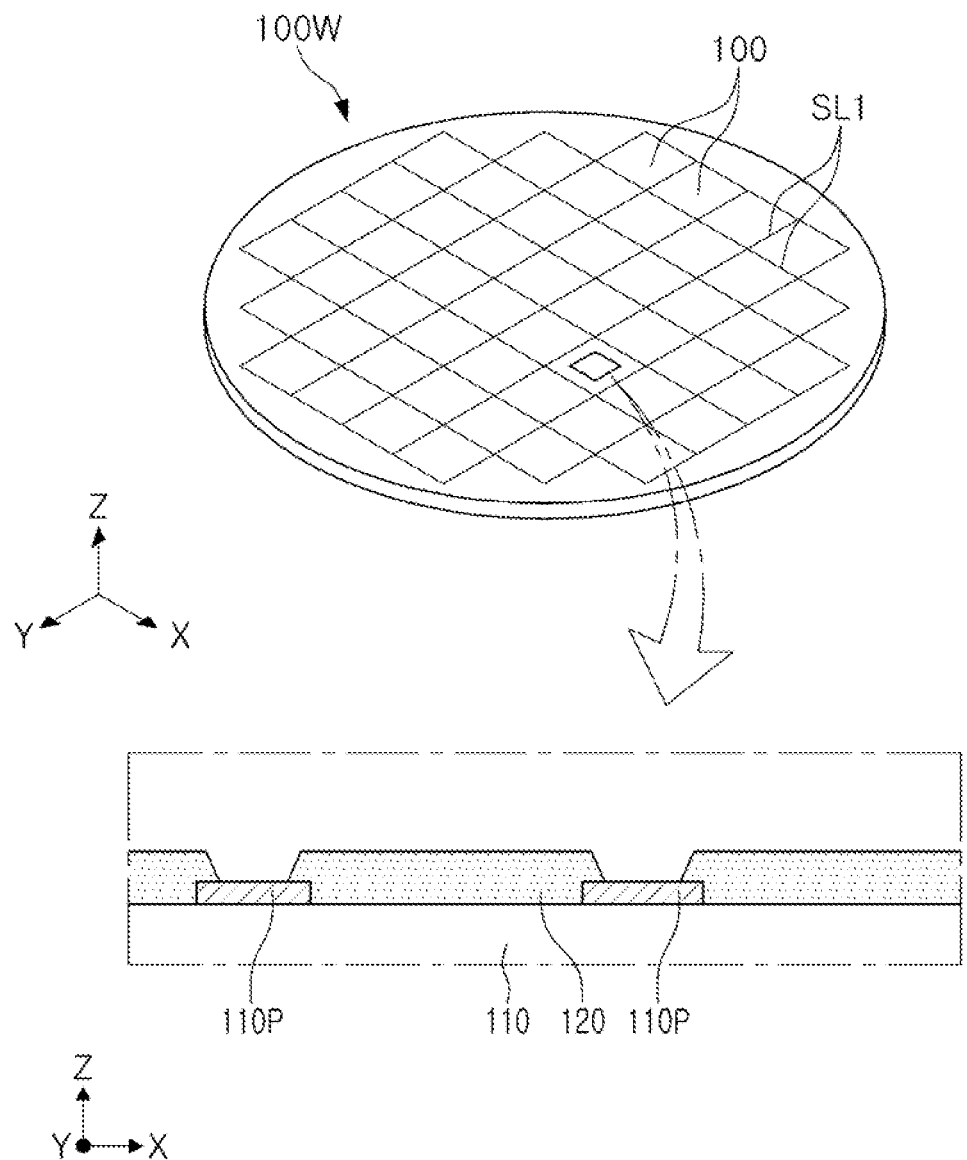
FIGS. 6A to 6E are cross-sectional views that illustrate a method of manufacturing a semiconductor package according to an embodiment of the present disclosure.

Referring to FIG. 6A, according to an embodiment, a semiconductor wafer 100W on which an integrated circuit is formed is prepared. The semiconductor wafer 100W includes a plurality of first semiconductor chips 100 separated by scribe lanes SL1. Each of the plurality of first semiconductor chips 100 includes a body 110 in which a connection pad 110P is disposed, and a passivation layer 120 that covers an upper surface of the body 110 and has an opening 120H that exposes at least a portion of the connection pad 110P. In addition, a metal layer may be formed on the passivation layer 120 and the exposed connection pad 110P. In this case, the connection pad 110P is exposed by removing the metal layer in an etching process.

Figure 6B:
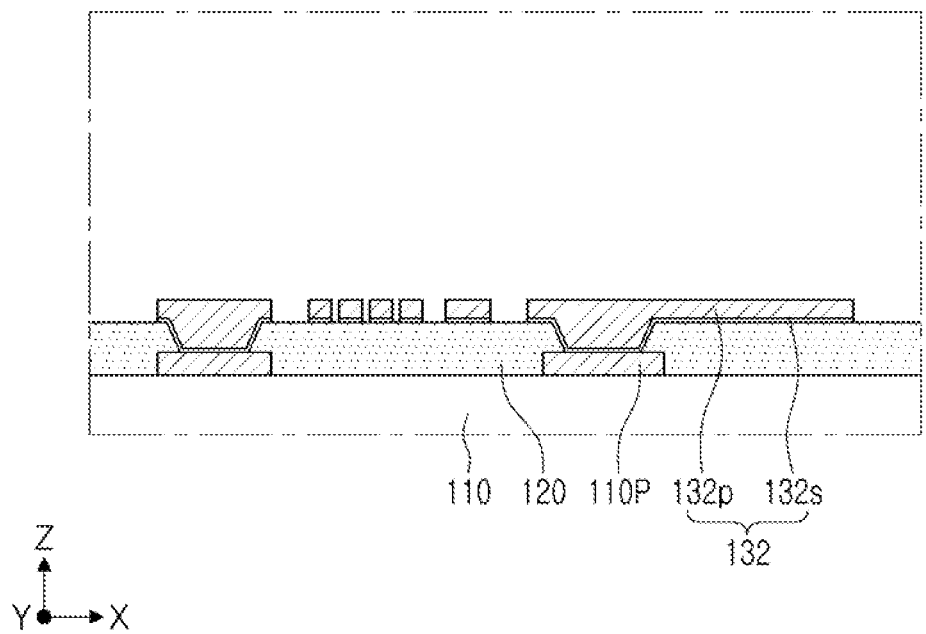

Referring to FIG. 6B, according to an embodiment, a first wiring pattern layer 132 that includes a first seed layer 132$s$ and a first plating layer 132$p$ is formed. The first wiring pattern layer 132 includes a first via portion 133 shown in FIG. 1C that penetrates the passivation layer 120. The first seed layer 132$s$ and the first plating layer 132$p$ are formed sequentially. The first seed layer 132$s$ is formed by depositing a metal, such as titanium (Ti) or copper (Cu), etc., on surfaces of the passivation layer 120 and the exposed connection pad 110P. The first seed layer 132$s$ is formed by a process such as electroless plating, chemical vapor deposition (CVD), or physical vapor deposition (PVD). In an embodiment, the first seed layer 132$s$ is formed using a sputtering process. Thereafter, a photoresist is formed on the first seed layer 132$s$ and the photoresist is patterned by performing an exposure process and a developing process. The first plating layer 132p is formed on those portions of the first seed layer 132s exposed by the patterned photoresist. In an embodiment, first plating layer 132p is formed by performing an electroplating process. The first plating layer 132p includes, for example, a metal such as copper (Cu) or an alloy that includes copper (Cu). The patterned photoresist is removed and the exposed first seed layer 132s is etched, thereby completing the first wiring pattern layer 132.

Figure 6C:
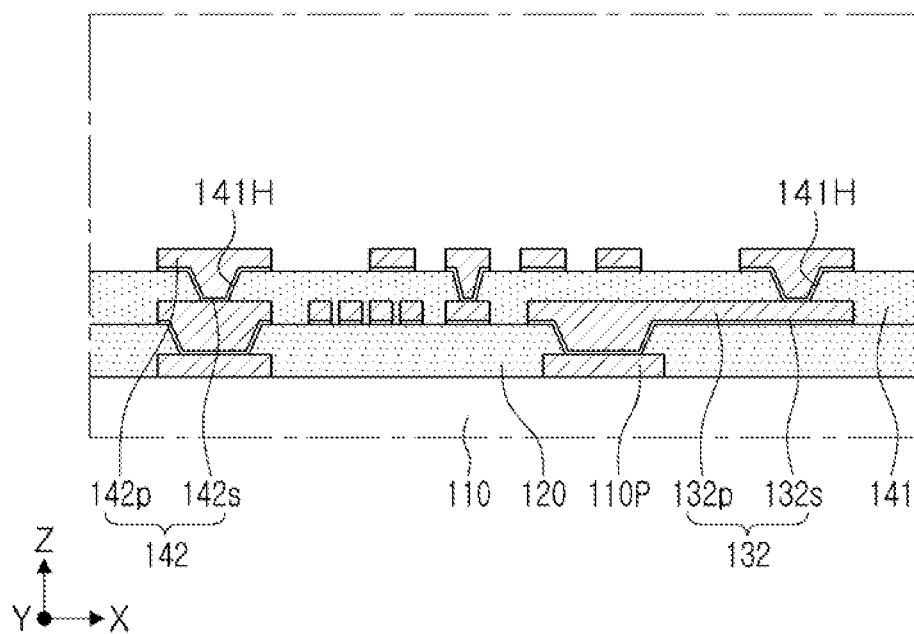

Referring to FIG. 6C, according to an embodiment, an insulating layer 141 and a second wiring pattern layer 142 are formed on the passivation layer 120 and the first wiring pattern layer 132. The second wiring pattern layer 142 includes a second seed layer 142s and a second plating layer 142p. The insulating layer 141 is formed by coating and curing a photosensitive resin, such as, for example, PID, that covers the passivation layer 120 and the first wiring pattern layer 132. Thereafter, via holes 141H that penetrate the insulating layer 141 are formed by performing an exposure process and a development process using a photomask. The via holes 141H expose portions of the surface of the first wiring pattern layer 132. The second seed layer 142s and the second plating layer 142p are sequentially formed on the surface of the insulating layer 141 and the exposed surface of the first wiring pattern layer 132. The second seed layer 142s and the second plating layer 142p are formed by repeating a process of manufacturing the first seed layer 132s and the first plating layer 132p described with reference to FIG. 6B. The second wiring pattern layer 142 includes a second via portion, 143 shown in FIG. 1C, that fills the via hole 141H, and first and second pad portions P1 and P2, also shown in FIG. 1C, that protrude from the insulating layer 141.

Figure 6D:
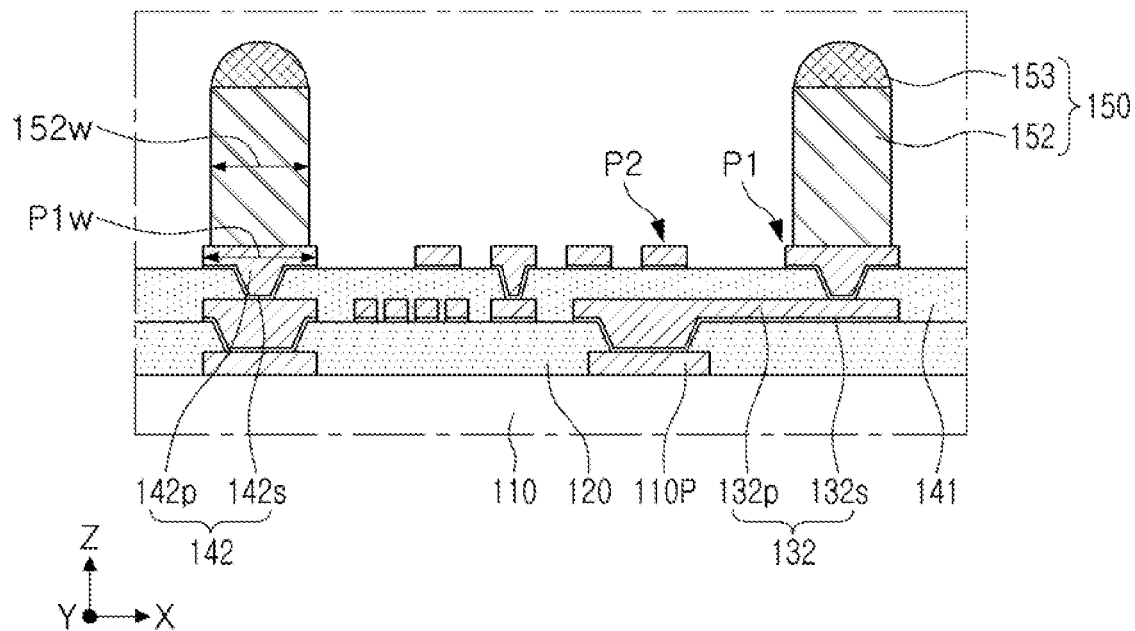

Referring to FIG. 6D, according to an embodiment, a first bump structure 150 is formed on the first pad portion P1 of the second wiring pattern layer 142. The first bump structure 150 includes a pillar-shaped pillar portion 152 that extends in the vertical direction (Z-axis direction) and a solder portion 153 formed on the pillar portion 152. The pillar portion 152 is formed by forming a photoresist on the insulating layer 141 and the second wiring pattern layer 142, and performing an exposure process, a developing process, and a plating process. The pillar portion 152 includes, for example, a metal such as copper (Cu) or an alloy that includes copper (Cu). In an embodiment, the photoresist is patterned such that a width 152w of the pillar portion 152 is less than a width P1w of the first pad portion P1. Thereafter, the photoresist is removed, and the solder portion 153 is formed on the upper surface of the pillar portion 152. The solder portion 153 is formed by applying a solder paste. The solder paste includes tin (Sn) or an alloy that includes tin (Sn).

Figure 6E:
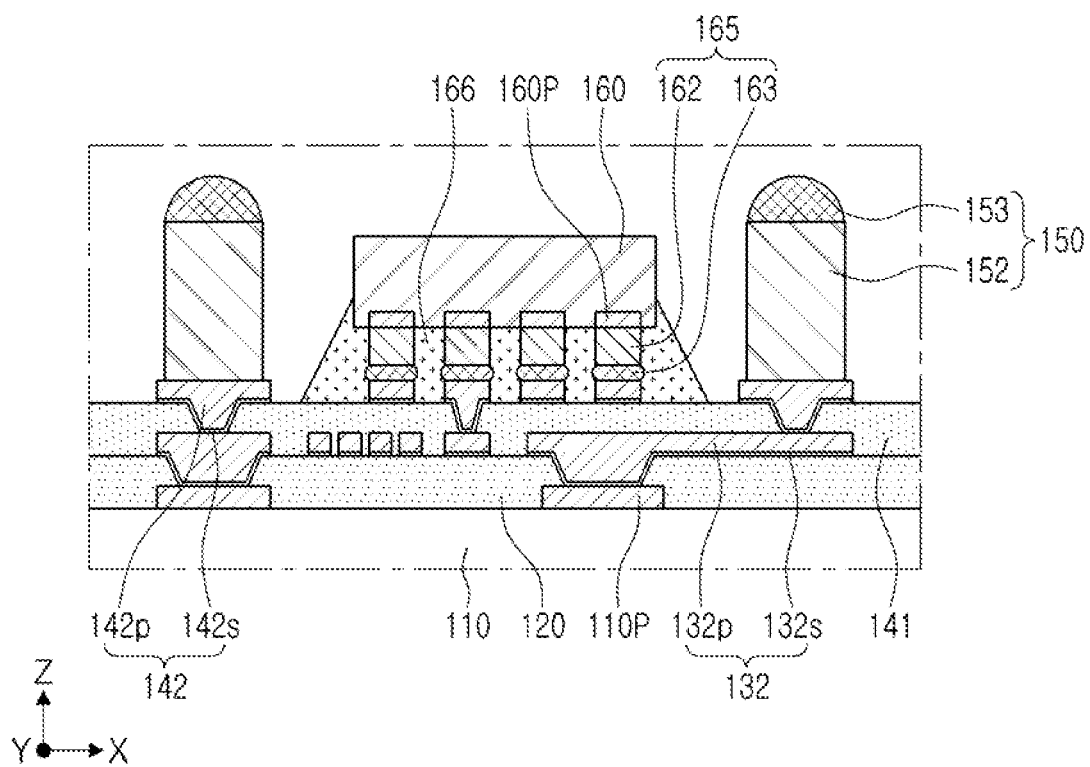

Referring to FIG. 6E, according to an embodiment, a passive device 160 is mounted on the second pad portion P2 of the second wiring pattern layer 142, and an underfill resin 166 is formed. The passive device 160 includes a plurality of third bump structures 165, and is mounted on the second pad portion P2 by a flip-chip method. The third bump structures 165 include a pillar portion 162 and a solder portion 163 similar to the first bump structure 150 described with reference to FIG. 6D. The underfill resin 166 includes an epoxy resin and is formed to surround side surfaces of the plurality of second bump structures 165.

Thereafter, according to an embodiment, the semiconductor wafer 100W in FIG. 6A is cut along the scribe lane SL1 such that chips of the upper body of a wafer are separated into a plurality of first semiconductor chips 100, as shown in FIG. 6A.

As described above, in embodiments, by redistributing the connection pad 110P that overlaps the passive device 160 to the position of the first pad portion P1 using the first wiring pattern layer 132, and securing the mounting area 160AR of the passive device, a passive device is mounted without changing a design of the semiconductor wafer 100W manufactured in a fab, shown in FIG. 6A. Accordingly, in an embodiment, SI and/or PI properties of the semiconductor package are improved without the addition of an expensive substrate, such as a silicon interposer.

FIGS. 7A to 7E are cross-sectional views that illustrate a method of manufacturing a semiconductor package in an embodiment. FIGS. 7A to 7E illustrate a manufacturing process of the redistribution substrate 200 illustrated in FIG. 1B. The redistribution substrate 200 is manufactured in the form of a wafer substrate or a panel substrate 200, shown in FIG. 7E, that includes a plurality of redistribution substrates 200, shown in FIG. 7E, that are separated from each other by a second scribe lane SL2 on a carrier CL, shown in FIG. 7E, that have a circular or polygonal shape, such as a rectangular shape, in an X-Y plane.

Figure 7A:
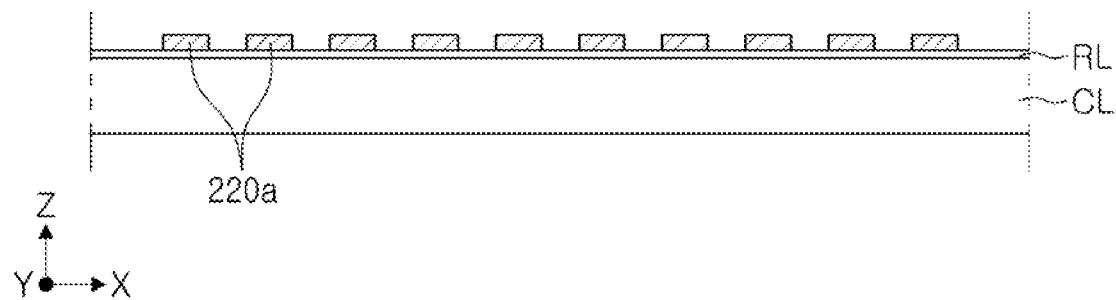
FIGS. 7A to 7E are cross-sectional views that illustrate a method of manufacturing a semiconductor package according to an embodiment of the present disclosure.

Referring to FIG. 7A, according to an embodiment, a first redistribution pattern layer 220a is formed on the carrier CL. A release layer RL for peeling off the carrier CL is disposed on the upper surface of the carrier CL. The first redistribution pattern layer 220a is formed by forming a photoresist on a seed layer formed by a process such as electroless plating or PVD, and performing an exposure process, a developing process, and a plating process. The seed layer is formed below the first redistribution pattern layer 220a, similar to the example described with reference to FIG. 6B. The first redistribution pattern layer 220a includes, for example, a metal such as copper (Cu) or an alloy that includes copper (Cu), and is herein referred to as under bump metallurgy (UBM).

Figure 7B:
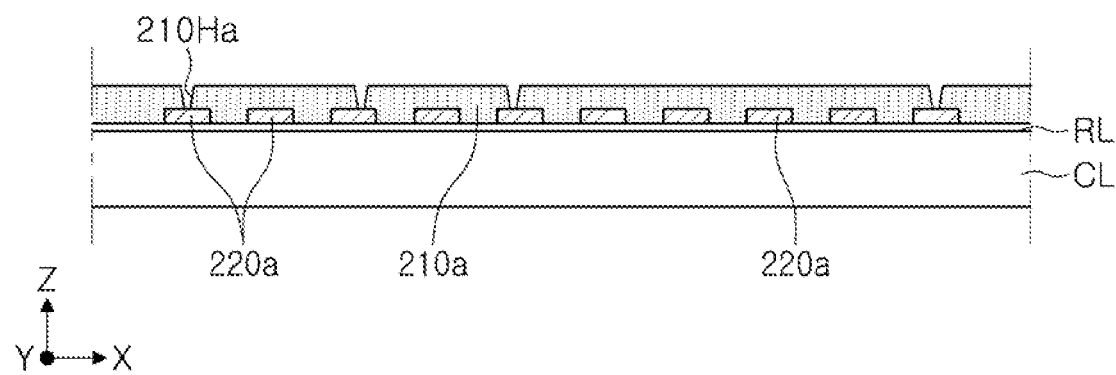

Referring to FIG. 7B, according to an embodiment, a 1-1 insulating layer 210a is formed on the carrier CL and the first redistribution pattern layer 220a, and a via hole 210Ha is formed that penetrates through a 1-1 insulating layer 210a. The 1-1 insulating layer 210a is formed by coating and curing a photosensitive resin, such as PID on the carrier CL. The via hole 210Ha is formed by a photolithography process. The photolithography process may be a series of processes that include an exposure process, a developing process, and a cleaning process.

Figure 7C:
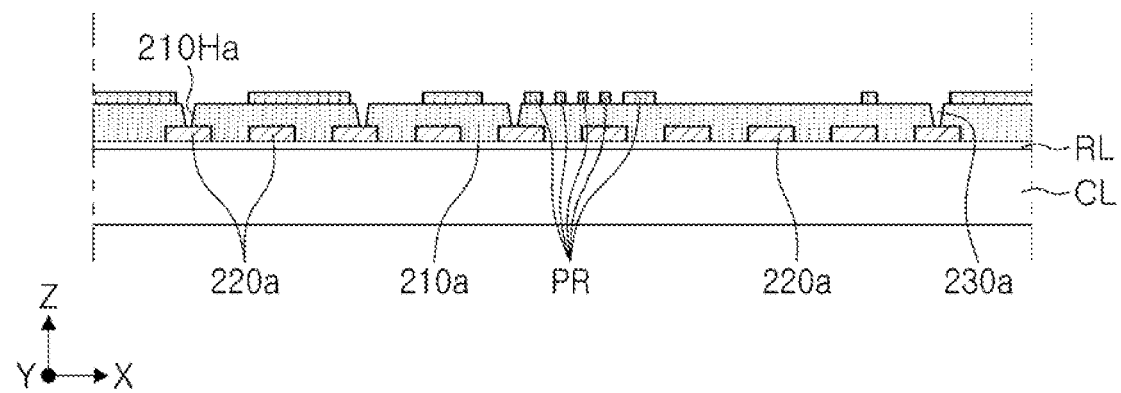

Referring to FIG. 7C, according to an embodiment, a patterned photoresist PR is formed on the 1-1 insulating layer 210a. The photoresist PR is coated on an entire surface of the 1-1 insulating layer 210a and is patterned by a photolithography process. A portion of the first-first insulating layer 210a and the via hole 210Ha are exposed by the patterned photoresist PR. Before coating the photoresist PR, a seed layer is formed on the upper surface of the 1-1 insulating layer 210a and in the via hole 210Ha by a method similar to that described with reference to FIG. 6B.

Figure 7D:
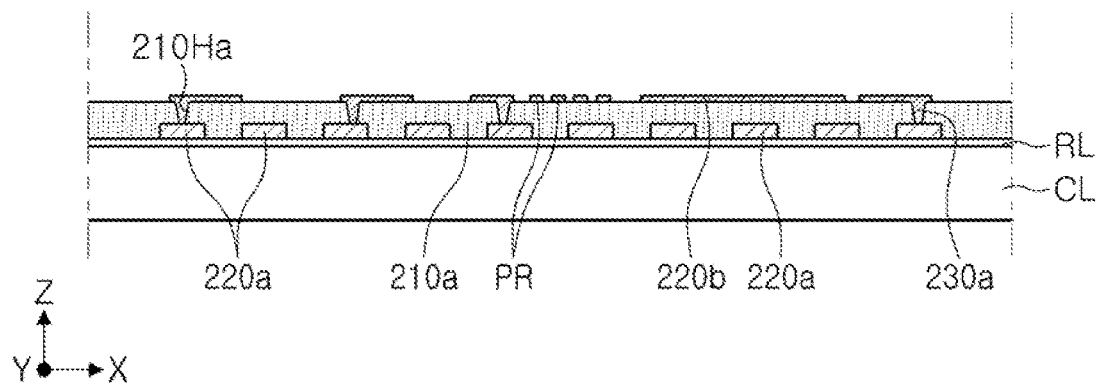

Referring to FIG. 7D, according to an embodiment, a first redistribution via 230a and a second redistribution pattern layer 220b are formed. The first redistribution via 230a and the second redistribution pattern layer 220b are simultaneously formed by performing a plating process. Thereafter, the photoresist PR in FIG. 7C is removed and the seed layer is etched, thereby completing the first redistribution via 230a and the second redistribution pattern layer 220b. The first redistribution via 230a and the second redistribution pattern layer 220b include, for example, a metal such as copper (Cu) or an alloy that includes copper (Cu).

Figure 7E:
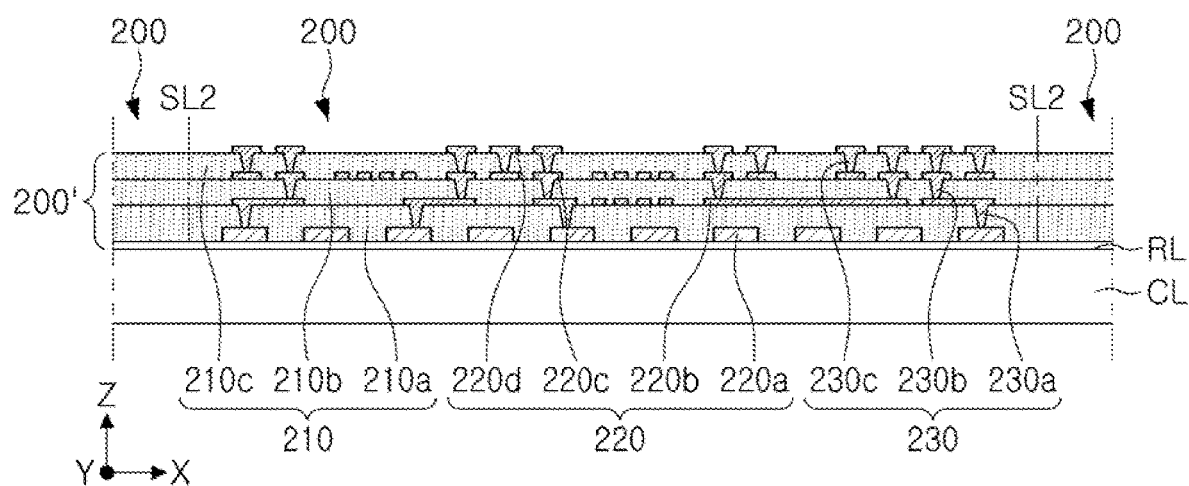

Referring to FIG. 7E, according to an embodiment, by repeating the processes described with reference to FIGS. 7B to 7D, a wafer substrate or a panel substrate 200' that includes 1-2 and 1-3 insulating layers 210b and 210c, third and fourth redistribution pattern layers 220c and 220d, and second and third redistribution vias 230b and 230c is manufactured. The wafer substrate or the panel substrate 200' is a redistribution substrate 200 that includes a plurality of insulating layers 210, a plurality of redistribution pattern layers 220, and a plurality of redistribution vias 230 separated by a second scribe lane SL2. In embodiments, the number of the insulating layers 210, the number of the redistribution pattern layers 220, and the number of the redistribution vias 230 may be greater than or less than the example illustrated in the drawings.

In an embodiment, since a passive device is directly mounted on the lower surface of a semiconductor chip, the SI and/or PI properties of the semiconductor package are improved without an additional expensive substrate. Accordingly, the expensive silicon interposer substrate on which the ISC is typically formed is replaced by the redistribution substrate 200 manufactured by a process described with reference to FIGS. 7A to 7E, and costs incurred in manufacturing a semiconductor package can be reduced.

Figure 8A:
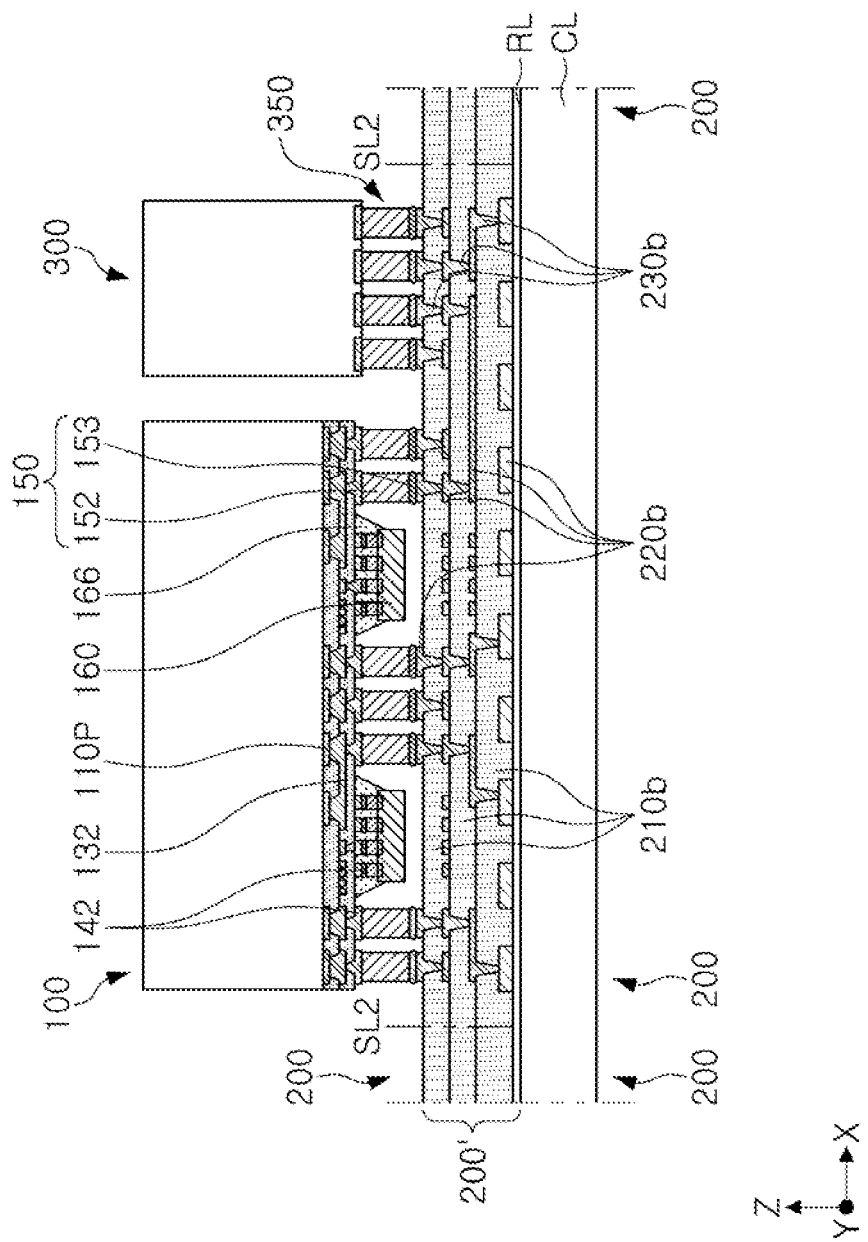
FIGS. 8A to 8C are cross-sectional views that illustrate a method of manufacturing a semiconductor package according to an embodiment of the present disclosure.
Figure 8B:
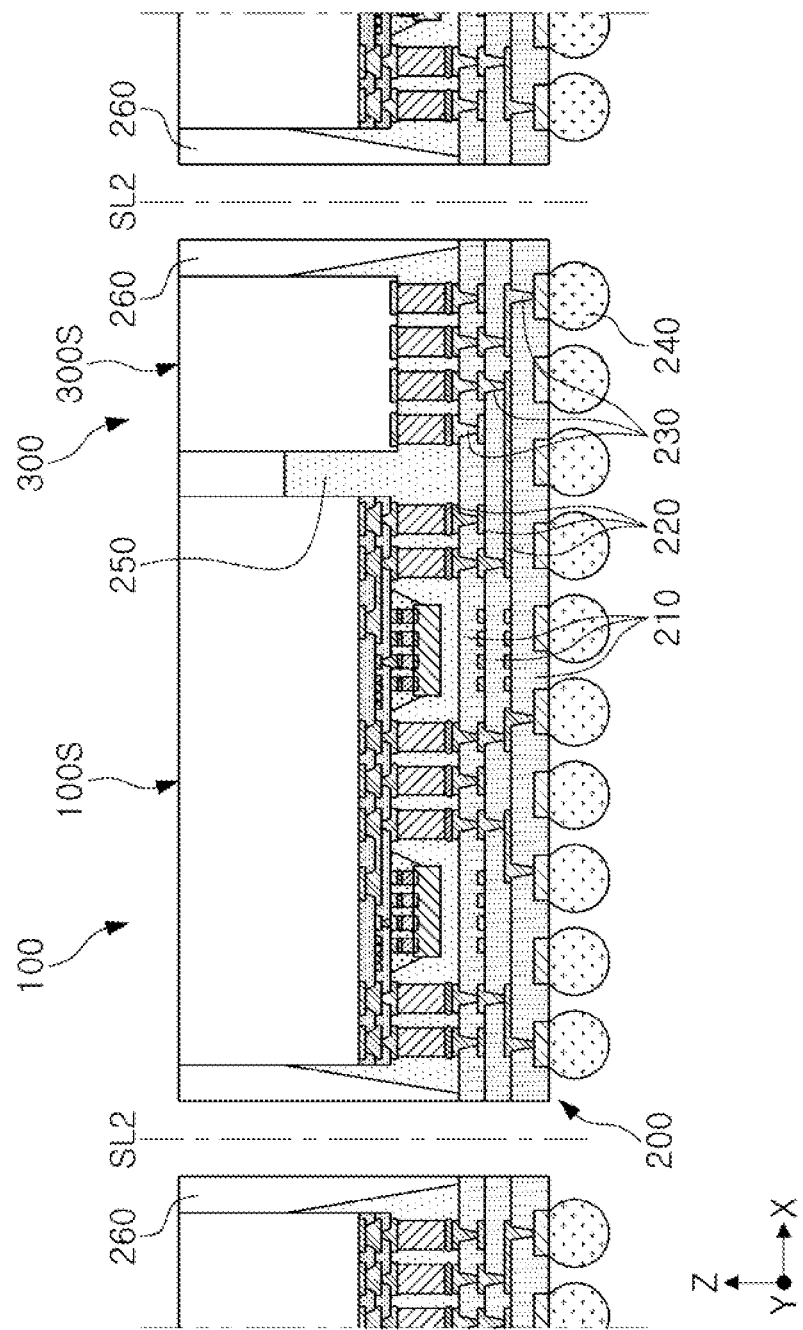
Figure 8C:
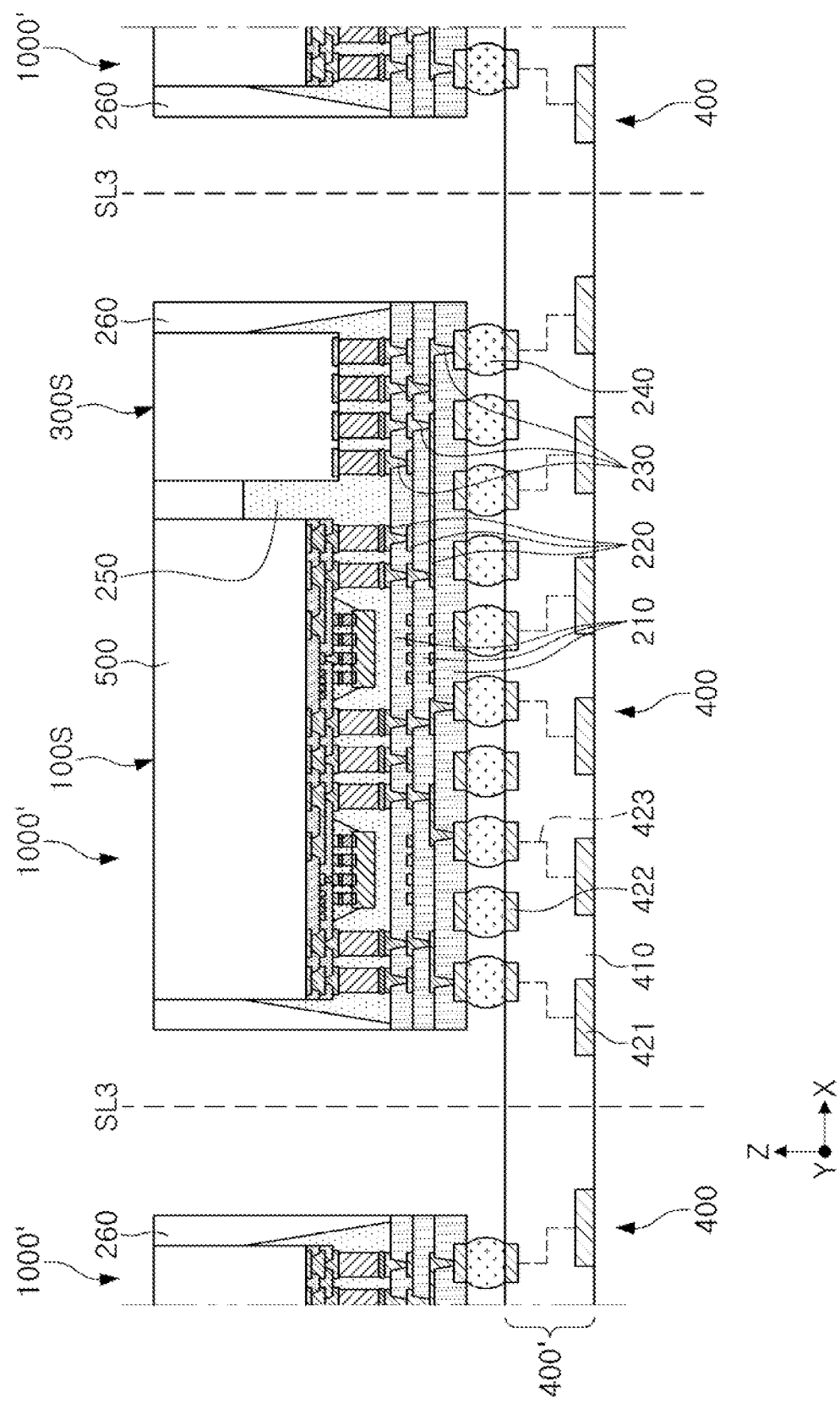

FIGS. 8A to 8C are cross-sectional views that illustrate a method of manufacturing a semiconductor package in an embodiment. FIGS. 8A to 8C illustrate a portion of a process of manufacturing the semiconductor package 1000 in FIG. 1B that uses the semiconductor chip 100 and the redistribution substrate 200 manufactured by the process in FIGS. 6A to 7E.

Referring to FIG. 8A, according to an embodiment, the semiconductor chip 100 and the chip structure 300 are each mounted on the redistribution substrates 200. In this case, the redistribution substrates 200 are integrated with each other such that the redistribution substrates 200 have a wafer substrate or a panel substrate 200' illustrated in FIG. 7E. The semiconductor chip 100 and the chip structure 300 are each mounted on the redistribution substrates 200 by performing a reflow process. The semiconductor chip 100 and the chip structure 300 are electrically connected to the redistribution pattern layer 220 through the bump structures 150 and 350.

Referring to FIG. 8B, according to an embodiment, an underfill resin 250 and an encapsulant 260 are each formed on the redistribution substrates 200. The underfill resin 250 is formed by coating and curing an insulating resin such as an epoxy resin on lower portions of the semiconductor chip 100 and the chip structure 300. In embodiments, a solder reflow process and an underfill hardening process are simultaneously performed. The encapsulant 260 is formed by applying and curing EMC on the redistribution substrates 200. The encapsulant 260 is formed to expose upper surfaces of the semiconductor chip 100 and the chip structure 300 by a polishing process. Thereafter, after inverting the upper and lower sides of the redistribution substrate 200 using an auxiliary carrier such as tape, a solder ball is attached onto the redistribution substrate 200, the second scribe lane SL2 is cut, and the redistribution substrates 200 are separated.

Referring to FIG. 8C, according to an embodiment, package structures 1000' are separated by cutting the second scribe lane SL2 in FIG. 8B and mounted on the base substrate 400' in the form of a wafer or panel. The base substrate 400' includes a plurality of base substrates 400 divided by the third scribe lane SL3. The package structure 1000' is connected to the redistribution circuit 423 of the base substrate 400 through first connection bumps 240, such as solder balls, disposed therebelow. Thereafter, after inverting the upper and lower sides of the base substrate 400 using an auxiliary carrier such as tape, a second connection bump 430, shown in FIG. 1B, is formed on the base substrate 400, and the base substrates 400 is separated by cutting the third scribe lane SL3.

Figure 9:
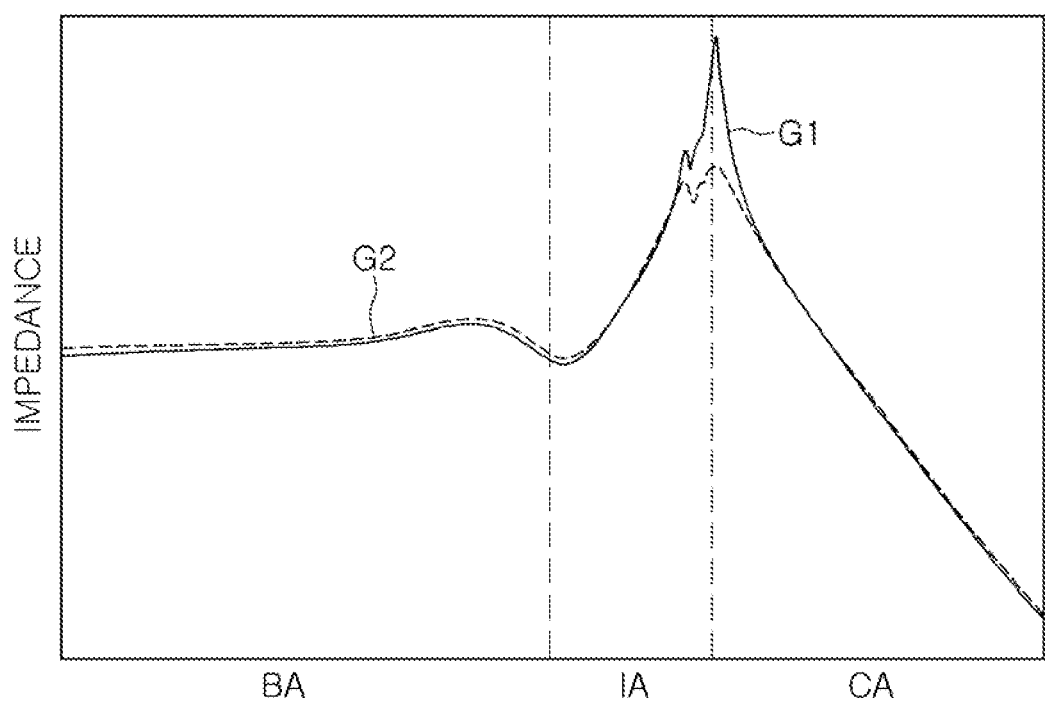
FIG. 9 shows graphs that illustrate changes in impedance depending on whether a passive device is provided in a semiconductor package illustrated in FIG. 1B.

FIG. 9 shows graphs that illustrate a simulation result of PI properties of a semiconductor package having a structure similar to an embodiment in FIG. 1B. FIG. 9 illustrates a graph G1 of a first test example and a graph G2 of a second test example. In the first test example, a change in impedance was simulated under the condition in which no passive device 160 was provided in the semiconductor package 1000 in FIG. 1B. In the second test example, a change in impedance was simulated under the condition in which the passive device 160 is mounted on an upper surface of the redistribution substrate 200, rather than on a lower surface of the semiconductor chip 100 in the semiconductor package 1000 in FIG. 1B. The graph G1 of the first test example and the graph G2 of the second test example illustrate the change in impedance throughout the board area BA, the interposer area IA, and the chip area CA. The board area BA corresponds to the main board on which the semiconductor package is mounted, the interposer area IA corresponds to the base substrate and the redistribution substrate of the semiconductor package, and the chip area CA corresponds to the semiconductor chip of the semiconductor package.

Referring to FIG. 9, in the first test example, the impedance rapidly increased in the interposer area IA, and a peak forms on a boundary between the interposer area IA and the chip area CA (see "G1"). In the second test example, the peak at a boundary between the interposer area IA and the chip area CA was lower than in the first test example (see "G2"). Accordingly, a noise filtering efficiency is improved by mounting a capacitor, and the PI properties of the semiconductor package are improved. However, in the simulation conditions, when the passive device is mounted on the redistribution substrate, a connection path between the semiconductor chip and the passive device elongates, such that noise filtering efficiency is reduced as compared to the capacitance of the passive device. In addition, since the mounting area of the passive devices on the redistribution substrate is limited, there may be limitations in the number of passive devices. In an embodiment, by introducing a wiring pattern layer disposed below the semiconductor chip and securing a mounting space for the passive device, the connection path between the semiconductor chip and the passive device is reduced, and PI and/or SI properties of the package effectively improve.

According to aforementioned embodiments, by introducing a wiring pattern layer that rearranges the connection pads of the semiconductor chip to secure a mounting area of the passive device on the semiconductor chip, a semiconductor package is provided that has improved PI properties.

While embodiments have been illustrated and described above, it will be apparent to those skilled in the art that modifications and variations can be made without departing from the scope of embodiments of the present disclosure as defined by the appended claims.

What is claimed is:
1. A semiconductor package, comprising:
a base substrate;
a redistribution substrate disposed on the base substrate, wherein the redistribution substrate includes one or more first insulating layers and one or more redistri- bution pattern layers disposed on the one or more first insulating layers, respectively;

a semiconductor chip disposed on the redistribution substrate and electrically connected to the one or more redistribution pattern layers;

a chip structure disposed on the redistribution substrate adjacent to the semiconductor chip and electrically connected to the semiconductor chip through the one or more redistribution pattern layers;

an underfill resin disposed between the redistribution substrate, the semiconductor chip and the chip structure; and an encapsulant that encapsulates at least a portion of each of the semiconductor chip and the chip structure, wherein the semiconductor chip includes:
a body that has an active surface that faces the redistribution substrate;
first and second contact pads spaced apart from each other below the active surface;
a first bump structure and a passive device electrically connected to the first contact pad at a lower level from that of the first contact pad; and
a second bump structure electrically connected to the second contact pad on a lower level from that of the second contact pad,
wherein the passive device is disposed between the first bump structure and the second bump structure in a direction parallel to the active surface, and below the semiconductor chip so that the semiconductor chip completely covers the passive device in a direction perpendicular to the active surface, and
the underfill resin fills a region between the first bump structure and the passive device and between the second bump structure and the passive device.

2. The semiconductor package of claim 1,
wherein the semiconductor chip includes:
a passivation layer disposed below the active surface wherein the passivation layer includes an opening that exposes at least a portion of each of the first and second contact pads;
a first wiring pattern layer disposed below the passivation layer and electrically connected to the first or second contact pad through the opening;
a second insulating layer that covers at least a portion of the first wiring pattern layer; and
a first pad and a second pad disposed below the second insulating layer and electrically connected to the first wiring pattern layer,
wherein the first bump structure is electrically connected to the first contact pad through the first pad and the first wiring pattern layer below the first pad, and
wherein the passive device is electrically connected to the first contact pad through the second pad and the first wiring pattern layer below the second pad.

3. The semiconductor package of claim 2, wherein the first pad has a width in the direction parallel to the active surface that is greater than a width of the second pad.

4. The semiconductor package of claim 2,
wherein the first pad does not overlap the passive device, and
wherein the second pad overlaps the passive device.

5. The semiconductor package of claim 2, wherein the first wiring pattern layer includes a first pattern portion that has one end connected to the first contact pad and an other end connected to the first pad, and a second pattern portion that has one end connected to the first contact pad and an other end connected to the second pad.

6. The semiconductor package of claim 2, wherein the first bump structure includes a pillar portion that has having one end connected to the first pad, and a solder portion disposed on an other end of the pillar portion opposite to the one end.

7. The semiconductor package of claim 2,
wherein the passive device includes a connection terminal and a third bump structure that connects the connection terminal to the second pad, and
wherein a height of the passive device and the third bump structure in the direction perpendicular to the active surface is less than a height of the first bump structure.

8. The semiconductor package of claim 7,
wherein the height of the passive device is about 80 μm or less, and
wherein the height of the first bump structure is about 90 μm or more.

9. The semiconductor package of claim 7, wherein the semiconductor chip further includes an underfill resin disposed between the passive device and the second insulating layer and that surrounds the third bump structure.

10. The semiconductor package of claim 2, wherein the first and second insulating layers include a photosensitive resin.

11. The semiconductor package of claim 2, wherein the passivation layer includes photosensitive polyimide.

12. The semiconductor package of claim 1, wherein at least a portion of the passive device overlaps the first contact pad in the direction perpendicular to the active surface.

13. The semiconductor package of claim 1, wherein the passive device includes a capacitor.

14. The semiconductor package of claim 1,
wherein the semiconductor chip includes a logic chip, and
wherein the chip structure includes at least one memory chip.

15. A semiconductor package, comprising:
a redistribution substrate that includes a redistribution pattern layer;
a semiconductor chip disposed on the redistribution substrate, wherein the semiconductor chip includes a plurality of connection pads, a first wiring pattern layer electrically connected to the plurality of connection pads, a second wiring pattern layer that includes a plurality of first pads and a plurality of second pads electrically connected to the first wiring pattern layer, a plurality of bump structures that electrically connect each of the plurality of first pads to the redistribution pattern layer, and at least one passive device mounted on the plurality of second pads; and
an underfill resin that fills a region between the plurality of bump structures and the at least one passive device,
wherein at least a portion of the plurality of connection pads overlaps the at least one passive device in a direction perpendicular to an active surface of the semiconductor chip that faces the redistribution substrate, and
wherein the first wiring pattern layer includes a first pattern portion that connects the portion of the connection pads that overlap the at least one passive device to at least a portion of the plurality of first pads.

16. The semiconductor package of claim 15,
wherein the plurality of first pads do not overlap the at least one passive device in a direction perpendicular to the active surface, and
wherein the plurality of second pads overlap the at least one passive device in a direction perpendicular to the active surface.

17. The semiconductor package of claim 15, wherein the first wiring pattern layer further includes a second pattern portion that connects the plurality of second pads to at least a portion of the plurality of connection pads.

18. The semiconductor package of claim 15,
wherein the plurality of connection pads include a power pad and a ground pad, and
wherein the plurality of second pads include a first group of second pads connected to the power pad and a second group of second pads connected to the ground pad.

19. A semiconductor package, comprising:
a semiconductor chip that includes a connection pad disposed on an active surface, a wiring pattern layer disposed on the connection pad, first and second pads disposed on the wiring pattern layer, a bump structure disposed on the first pad, and at least one passive device disposed on the second pad; and
an underfill resin that fills a region between the at least one passive device and the semiconductor chip,
wherein the first pad does not overlap the at least one passive device in a direction perpendicular to the active surface,
wherein the connection pad and the second pad overlap the at least one passive device in a direction perpendicular to the active surface, and
wherein the wiring pattern layer includes a first pattern portion that connects the connection pad to the first pad.

* * * * *